(12) United States Patent
Helmrich et al.

(10) Patent No.: US 11,056,854 B2
(45) Date of Patent: Jul. 6, 2021

(54) LASER ASSEMBLY AND RELATED METHODS

(71) Applicant: LASERTEL, INC., Tucson, AZ (US)

(72) Inventors: Jason Helmrich, Tucson, AZ (US); Steven Smith, Tucson, AZ (US); Prabhu Thiagarajan, Tucson, AZ (US)

(73) Assignee: LEONARDO ELECTRONICS US INC., Tucson, AZ (US)

( * ) Notice: Subject to any disclaimer, the term of this patent is extended or adjusted under 35 U.S.C. 154(b) by 0 days.

(21) Appl. No.: 16/540,961

(22) Filed: Aug. 14, 2019

(65) Prior Publication Data

US 2020/0059067 A1    Feb. 20, 2020

Related U.S. Application Data

(60) Provisional application No. 62/718,833, filed on Aug. 14, 2018.

(51) Int. Cl.
*H01S 5/022* (2021.01)
*H01S 5/40* (2006.01)
*H01S 5/068* (2006.01)
*G02B 27/09* (2006.01)
*G02B 27/30* (2006.01)
*H01S 5/024* (2006.01)
(Continued)

(52) U.S. Cl.
CPC ........ *H01S 5/0237* (2021.01); *H01S 5/02326* (2021.01); *H01S 5/02469* (2013.01); *H01S 5/068* (2013.01); *H01S 5/4025* (2013.01); *G02B 27/0922* (2013.01); *G02B 27/30* (2013.01)

(58) Field of Classification Search
CPC ...... H01S 5/02296; H01S 5/068; H01S 5/024; H01S 5/022; H01S 5/40; H01S 5/4062; G02B 27/0922; G02B 27/30
USPC ........................................ 372/50.12
See application file for complete search history.

(56) References Cited

U.S. PATENT DOCUMENTS

| | | | |
|---|---|---|---|
| 3,711,939 A | 1/1973 | Stoll | 228/246 |
| 3,805,375 A | 4/1974 | LaCombe et al. | 29/832 |
| 3,936,322 A | 2/1976 | Blum et al. | 148/1.5 |

(Continued)

FOREIGN PATENT DOCUMENTS

| | | | | |
|---|---|---|---|---|
| CA | 2 208 370 C | 7/2005 | | H01S 5/20 |
| DE | 968430 | 2/1958 | | |

(Continued)

OTHER PUBLICATIONS

U.S. Appl. No. 11/829,030, filed Jul. 26, 2007.
(Continued)

*Primary Examiner* — Tuan N Nguyen
(74) *Attorney, Agent, or Firm* — Hayes Soloway P.C.

(57) ABSTRACT

An epoxy-free laser assembly includes at least one laser array and at least one optics assembly positioned within an optical path of at least one laser array. The laser array and the optics assembly are epoxy-free. In one example, the optics assembly has a beam shaping optic and a wavelength stabilization optic, wherein the wavelength stabilization optic is connected to beam shaping optic with at least one tab and solder. In another example, a plurality of optics assemblies is included within the laser assembly, whereby the laser array and all of the plurality of optics assemblies fit within a footprint of the heatsink. Methods of manufacturing the same are also provided.

17 Claims, 16 Drawing Sheets

(51) Int. Cl.
  *H01S 5/0237* (2021.01)
  *H01S 5/02326* (2021.01)

(56) References Cited

U.S. PATENT DOCUMENTS

| | | | |
|---|---|---|---|
| 4,092,614 A | 5/1978 | Sakuma et al. | |
| 4,156,879 A | 5/1979 | Lee | 357/22 |
| 4,306,278 A | 12/1981 | Fulton et al. | 362/259 |
| 4,653,056 A | 3/1987 | Baer et al. | |
| 4,767,674 A | 8/1988 | Shirai | 257/E23.006 |
| 4,803,691 A | 2/1989 | Scifres et al. | 372/150 |
| 4,881,237 A | 11/1989 | Donnelly | |
| 4,903,274 A | 2/1990 | Taneya et al. | |
| 4,947,401 A | 8/1990 | Hinata et al. | |
| 4,980,893 A | 12/1990 | Thornton et al. | |
| 4,993,148 A | 2/1991 | Adachi | 174/252 |
| 5,008,737 A | 4/1991 | Burnham et al. | 357/81 |
| 5,031,187 A | 7/1991 | Orenstein et al. | |
| 5,040,187 A | 8/1991 | Karpinski | |
| 5,045,972 A | 9/1991 | Supan | C22C 26/00 |
| 5,060,237 A | 10/1991 | Peterson | |
| 5,061,974 A | 10/1991 | Onodera et al. | |
| 5,099,488 A | 3/1992 | Ahrabi et al. | |
| 5,102,825 A | 4/1992 | Brennan et al. | 437/129 |
| 5,105,429 A | 4/1992 | Mundinger et al. | |
| 5,105,430 A | 4/1992 | Mundinger et al. | |
| 5,128,951 A | 7/1992 | Karpinski | |
| 5,202,706 A | 4/1993 | Hasegawa | 359/819 |
| 5,212,706 A | 5/1993 | Jain | |
| 5,212,707 A | 5/1993 | Heidel et al. | |
| 5,253,260 A | 10/1993 | Palombo | 372/34 |
| 5,284,790 A | 2/1994 | Karpinski | |
| 5,298,762 A | 3/1994 | Ou | 257/13 |
| 5,305,344 A | 4/1994 | Patel | |
| 5,311,530 A | 5/1994 | Wagner et al. | 372/36 |
| 5,311,535 A | 5/1994 | Karpinski | |
| 5,325,384 A | 6/1994 | Herb et al. | |
| 5,394,426 A | 2/1995 | Joslin | |
| 5,418,799 A | 5/1995 | Tada | |
| 5,440,577 A | 8/1995 | Tucker | |
| 5,450,430 A | 9/1995 | Chung | 372/38 |
| 5,455,738 A | 10/1995 | Montesano et al. | 361/707 |
| 5,497,391 A | 3/1996 | Paoli | |
| 5,504,767 A | 4/1996 | Jamison et al. | |
| 5,521,931 A | 5/1996 | Biegelsen et al. | 372/36 |
| 5,526,373 A | 6/1996 | Karpinski | |
| 5,568,498 A | 10/1996 | Nilsson | |
| 5,593,815 A | 1/1997 | Ahn | 430/321 |
| 5,627,850 A | 5/1997 | Irwin et al. | |
| 5,644,586 A | 7/1997 | Kawano et al. | |
| 5,679,963 A | 10/1997 | Klem et al. | 257/46 |
| 5,764,675 A | 6/1998 | Juhala | |
| 5,778,020 A | 7/1998 | Gokay | |
| 5,783,316 A | 7/1998 | Colella et al. | |
| 5,812,573 A | 9/1998 | Shiomi et al. | |
| 5,835,515 A | 11/1998 | Huang | |
| 5,835,518 A | 11/1998 | Mundinger et al. | 372/50 |
| 5,848,083 A | 12/1998 | Haden et al. | 372/36 |
| 5,856,990 A | 1/1999 | Nilsson | 359/344 |
| 5,909,458 A | 6/1999 | Freitas et al. | 372/36 |
| 5,913,108 A | 6/1999 | Stephens et al. | |
| 5,923,692 A | 7/1999 | Staskus et al. | |
| 5,930,279 A | 7/1999 | Apollonov et al. | 372/50 |
| 5,987,045 A | 11/1999 | Albares et al. | 372/38 |
| 6,031,285 A | 2/2000 | Nishibayashi | |
| 6,101,208 A | 8/2000 | Gokay | |
| 6,208,677 B1 | 3/2001 | Moyer | 372/66 |
| 6,252,179 B1 | 6/2001 | Lauffer | 174/255 |
| 6,281,471 B1 | 8/2001 | Smart | 219/121.62 |
| 6,295,307 B1 | 9/2001 | Hoden et al. | 372/36 |
| 6,352,873 B1 | 3/2002 | Hoden | 438/28 |
| 6,396,857 B1 | 5/2002 | Labranche | |
| 6,424,667 B1 | 7/2002 | Endriz et al. | |
| 6,480,514 B1 | 11/2002 | Lorenzen et al. | 372/35 |
| 6,493,373 B1 | 12/2002 | Boucart | 257/33.069 |
| 6,535,533 B2 | 3/2003 | Lorenzen et al. | 372/34 |
| 6,535,541 B1 | 3/2003 | Boucart et al. | 372/96 |
| 6,542,531 B2 | 4/2003 | Sirbu | B82Y 20/00 |
| 6,727,117 B1 | 4/2004 | McCoy | |
| 6,865,200 B2 | 3/2005 | Takigawa et al. | |
| 7,016,383 B2 | 3/2006 | Rice | |
| 7,286,359 B2 | 10/2007 | Khbeis et al. | |
| 7,359,413 B2 | 4/2008 | Tzuk et al. | 372/34 |
| 7,529,286 B2 | 5/2009 | Gokay et al. | 372/69 |
| 7,660,335 B2 | 2/2010 | Thiagarajan et al. | 372/34 |
| 7,864,825 B2 | 1/2011 | Thiagarajan et al. | 372/36 |
| 7,944,955 B2 | 5/2011 | Thiagarajan et al. | 372/34 |
| 8,017,935 B2 | 9/2011 | Staszewski et al. | 257/27 |
| 8,653,550 B2 | 2/2014 | Mastro | H01L 33/40 |
| 8,664,524 B2 | 3/2014 | Gamett | H01L 31/02966 |
| 8,848,753 B2 | 9/2014 | Koenning | 372/29.021 |
| 10,120,149 B1* | 11/2018 | Mathai | G02B 6/425 |
| 2001/0017870 A1 | 8/2001 | Hayakawa | 372/40 |
| 2002/0001864 A1 | 1/2002 | Ishikawa et al. | |
| 2002/0009106 A1 | 1/2002 | Miyokawa et al. | |
| 2002/0014631 A1 | 2/2002 | Iwata | 257/89 |
| 2002/0025096 A1 | 2/2002 | Wang et al. | 385/8 |
| 2002/0086483 A1 | 7/2002 | Kim | 438/264 |
| 2002/0086486 A1 | 7/2002 | Tanaka | H01L 21/28518 |
| 2003/0116767 A1 | 6/2003 | Kneissl et al. | 257/79 |
| 2004/0037340 A1 | 2/2004 | Yanagisawa | |
| 2004/0052280 A1 | 3/2004 | Rice | |
| 2004/0082112 A1 | 4/2004 | Stephens | |
| 2004/0125459 A1 | 7/2004 | Tanitsu et al. | 359/619 |
| 2004/0264521 A1 | 12/2004 | Ness et al. | |
| 2005/0095755 A1 | 5/2005 | Nakata et al. | |
| 2005/0232628 A1 | 10/2005 | Von Freyhold et al. | 398/41 |
| 2005/0254539 A1 | 11/2005 | Klimek | |
| 2006/0011938 A1 | 1/2006 | Debray | 257/104 |
| 2006/0197100 A1 | 9/2006 | Shen | 257/94 |
| 2007/0116079 A1 | 5/2007 | Giniunas et al. | 372/69 |
| 2007/0273957 A1 | 11/2007 | Zalevsky | G02B 27/1093 |
| 2008/0089380 A1 | 4/2008 | Konig et al. | 372/75 |
| 2008/0123710 A1 | 5/2008 | Brick | B82Y 20/00 |
| 2008/0130223 A1 | 6/2008 | Nakamura | H02M 7/003 |
| 2008/0213710 A1 | 9/2008 | Schultz | F23N 1/027 |
| 2008/0259983 A1 | 10/2008 | Troccoli | 372/6 |
| 2009/0015185 A1 | 1/2009 | Yoshida | 318/504 |
| 2009/0090932 A1 | 4/2009 | Bour et al. | 257/103 |
| 2010/0012188 A1 | 1/2010 | Garnett | 136/260 |
| 2011/0051759 A1* | 3/2011 | Telford | H01S 5/0428 |
| | | | 372/35 |
| 2011/0103409 A1 | 5/2011 | Sipes | G02B 6/4296 |
| 2011/0241549 A1 | 10/2011 | Wootton | 315/117 |
| 2011/0280269 A1 | 11/2011 | Ghang-Hasnain | H01S 5/105 |
| 2012/0114001 A1 | 5/2012 | Fang et al. | 372/45.01 |
| 2012/0153254 A1 | 6/2012 | Mastro | 257/13 |
| 2012/0252144 A1 | 10/2012 | Schroeder et al. | 438/26 |
| 2012/0287958 A1 | 11/2012 | Lell | H01S 5/323 |
| 2013/0016752 A1 | 1/2013 | Lell | H01S 5/323 |
| 2013/0259074 A1 | 10/2013 | Newman | H01S 3/04 |
| 2013/0271959 A1 | 10/2013 | Woodgate | G09F 13/04 |
| 2014/0293554 A1 | 10/2014 | Shashkov | 361/748 |
| 2015/0063387 A1 | 3/2015 | Joseph et al. | H01S 5/02438 |
| 2015/0162478 A1 | 6/2015 | Fafard | 257/461 |
| 2015/0207011 A1 | 7/2015 | Gamett | H01L 31/0368 |
| 2015/0207294 A1 | 7/2015 | Brick et al. | H01S 5/10 |
| 2015/0255960 A1 | 9/2015 | Kanskar | H01S 5/4075 |
| 2016/0014878 A1 | 1/2016 | Kilhenny | 257/99 |
| 2017/0051884 A1 | 2/2017 | Raring | |
| 2017/0288367 A1* | 10/2017 | Taniguchi | H01S 5/4075 |
| 2017/0338194 A1 | 11/2017 | Gittemeier | |
| 2018/0152000 A1 | 5/2018 | Crawford et al. | H01S 5/02288 |
| 2018/0254606 A1* | 9/2018 | McElhinney | H01S 5/02484 |
| 2018/0261975 A1 | 9/2018 | Pavlov | |
| 2018/0335582 A1* | 11/2018 | Ishige | G02B 27/0922 |
| 2018/0337513 A1* | 11/2018 | Crawford | H01S 5/04252 |
| 2020/0027839 A1 | 1/2020 | Hino | H01L 23/49 |
| 2020/0075529 A1 | 3/2020 | Otsuka | |

FOREIGN PATENT DOCUMENTS

| | | | |
|---|---|---|---|
| DE | 19518177 | 11/1996 | H01S 3/0941 |
| DE | 10062579 | 6/2001 | |

(56) References Cited

FOREIGN PATENT DOCUMENTS

| DE | 102008040374 | 1/2010 | ............... H01S 5/40 |
|---|---|---|---|
| EP | 1439618 | 7/2004 | ............. H01S 5/024 |
| EP | 1452614 | 9/2004 | ............. H01S 5/024 |
| EP | 1811617 | 7/2007 | ............. H01S 5/024 |
| EP | 1887666 | 2/2008 | ............. H01S 5/024 |
| EP | 2110903 | 10/2009 | ............... H01S 5/00 |
| EP | 2305400 | 4/2011 | ............. B22D 19/00 |
| JP | 2002111058 | 4/2002 | ............. H01L 33/00 |

OTHER PUBLICATIONS

U.S. Appl. No. 09/556,767, filed Apr. 24, 2020.
U.S. Appl. No. 09/170,491, filed Oct. 13, 1998.
U.S. Appl. No. 12/105,126, filed Apr. 17, 2008.
U.S. Appl. No. 12/648,141, filed Dec. 28, 2009.
U.S. Appl. No. 14/728,923, filed Jun. 2, 2015.
U.S. Appl. No. 15/167,748, filed May 27, 2016.
U.S. Appl. No. 15/363,874, filed Nov. 29, 2016.
U.S. Appl. No. 15/601,820, filed May 22, 2017.
U.S. Appl. No. 11/299,029, filed Dec. 9, 2005.
U.S. Appl. No. 16/539,889, filed Aug. 13, 2019.
U.S. Appl. No. 16/734,133, filed Jan. 3, 2020.
U.S. Appl. No. 16/895,961, filed Jun. 8, 2020.
U.S. Appl. No. 17/022,767, filed Sep. 16, 2020.
Chinese Official Action issued in related Chinese Patent Application Serial No. 201780073945.8, dated Sep. 21, 2020 (16 pages) with translation.
Official Action issued in Applicants' corresponding EPO Application Serial No. 07117048.7-2222, dated Aug. 6, 2009, 4 pages.
Official Action issued in Applicants' corresponding EPO Application Serial No. 07117048.7-2222, dated Nov. 20, 2008, 9 pages.
Intention to Grant issued in Applicants' corresponding EPO Application Serial No. 09157643.9, dated Apr. 7, 2017, 6 pages.
Official Action issued in Applicants' corresponding EPO Application Serial No. 09157643.9, dated Aug. 22, 2016, 5 pages.
Official Action issued in Applicants' corresponding EPO Application Serial No. 09157643.9, dated Apr. 16, 2014, 2 pages.
European Search Report issued in application No. 09157643.9, dated Aug. 9, 2013 (7 pgs).
European Search Report issued in application No. 20150730.8, dated Jul. 3, 2020 (8 pgs).
Intention to Grant issued in Applicants' corresponding EPO Application Serial No. 16172620.3, dated Jul. 19, 2019, 3 pages.
European Search Report issued in application No. 18173282.7-1211, dated Oct. 8, 2018 (8 pgs).
Intention to Grant issued in Applicants' corresponding EPO Application Serial No. 06845311.7, dated Nov. 9, 2010, 5 pages.
European Search Report issued in application No. 06845311.7, dated Mar. 31, 2010 (9 pgs).
Official Action issued in European application No. 18173282.7-1211, dated Jan. 23, 2020 (6 pgs).
European Search Report issued in application No. 16172620.3, dated Oct. 25, 2016 (9 pgs).
European Search Report issued in application No. 20150730.8, dated Jul. 3, 2020 (9 pages).
European Supplemental Search Report issued in related European Patent Application 17875888.4, dated Jul. 9, 2020 (11 pages).
Feng, et al., "High efficient GaN-based laser diodes with tunnel junction", Applied Physics Letters 103, AIP Publishing, LLC, 2013.
Riepnch, et al., "Proceedings of SPIE—Assessment of factors regulating the thermal lens profile and lateral brightness in high power diode lasers", SPIEL ASE, 2017.
Office Action issued in U.S. Appl. No. 15/363,874, dated Jul. 18, 2019 (24 pgs).
Office Action issued in U.S. Appl. No. 15/363,874, dated Apr. 24, 2018 (10 pgs).
Office Action issued in U.S. Appl. No. 15/363,874, dated Feb. 14, 2019 (13 pgs).

Office Action issued in U.S. Appl. No. 15/363,874, dated Mar. 6, 2020 (12 pgs).
Office Action issued in U.S. Appl. No. 15/363,874, dated Jun. 15, 2020 (12 pgs).
Office Action issued in U.S. Appl. No. 15/363,874, dated Oct. 14, 2020 (11 pgs).
Office Action issued in U.S. Appl. No. 15/363,874, dated Oct. 4, 2018 (14 pgs).
Notice of Allowance issued in U.S. Appl. No. 15/363,874, dated Feb. 2, 2021 (7 pgs).
Office Action issued in U.S. Appl. No. 14/728,923, dated Aug. 9, 2018 (17 pgs).
Office Action issued in U.S. Appl. No. 14/728,923, dated Apr. 19, 2018 (16 pgs).
Office Action issued in U.S. Appl. No. 14/728,923, dated Oct. 2, 2017 (11 pgs).
Office Action issued in U.S. Appl. No. 12/105,126, dated Jul. 23, 2009 (7 pgs).
Office Action issued in U.S. Appl. No. 12/105,126, dated Apr. 24, 2009 (8 pgs).
Notice of Allowance issued in U.S. Appl. No. 12/105,126, dated Sep. 22, 2009 (7 pgs).
Notice of Allowance issued in U.S. Appl. No. 12/648,141, dated Jan. 11, 2011 (11 pgs).
Office Action issued in U.S. Appl. No. 16/539,889, dated Feb. 1, 2021 (18 pgs).
Office Action issued in U.S. Appl. No. 16/539,889, dated Oct. 21, 2020 (16 pgs).
Office Action issued in U.S. Appl. No. 16/539,889, dated Jul. 1, 2020 (19 pgs).
Office Action issued in U.S. Appl. No. 11/299,029, dated Aug. 22, 2008 (8 pgs).
Office Action issued in U.S. Appl. No. 16/540,961, dated Nov. 17, 2020 (13 pgs).
Office Action issued in U.S. Appl. No. 16/540,961, dated Aug. 5, 2020 (9 pgs).
Office Action issued in U.S. Appl. No. 11/829,030, dated Nov. 30, 2009 (16 pgs).
Office Action issued in U.S. Appl. No. 11/829,030, dated Jun. 24, 2009 (13 pgs).
Office Action issued in U.S. Appl. No. 11/829,030, dated Apr. 3, 2009 (13 pgs).
Office Action issued in U.S. Appl. No. 11/829,030, dated Nov. 12, 2008 (12 pgs).
Notice of Allowance issued in U.S. Appl. No. 11/829,030, dated Aug. 30, 2010 (7 pgs).
Giri et al, "Influence of Hot Electron Scattering and Electron-Phonon Interactions on Thermal Boundary Conductance at Metal/Nonmetal Interfaces" Journal of Heat Transfer, vol. 136, dated Sep. 2014 (6 pgs).
Martin et al., "Thermal Behavior of Visible AlGaInP—GaInP Ridge Laser Diodes" IEEE Journal of Quantum Electronics, vol. 28, No. 11, dated Nov. 1992 (7 pgs).
Monachon , C., "Thermal Boundary Conductance Between Metals and Dielectrics" thesis for the graduation of Doctor of Science, Federal Institute of Technology in Lausanne, 2013 (251 pgs).
Nekorkin et al., "Nonlinear mode mixing in dual-wavelength semiconductor lasers with tunnel junctions", Applied Physics Letters 90, 171106 (2007) (3 pgs).
Notice of Allowance issued in U.S. Appl. No. 15/601,820, dated Jun. 11, 2019 (8 pgs).
Rieprich et al., "Assessment of Factors Regulating the Thermal Lens Profile and Lateral Brightness in High Power Diode Lasers" Proc of SPIE, vol. 10085, No. 1008502-1, dated 2017 (10 pgs).
Zhang et al., "Thermal Transport Across Metal-Insulator Interface via Electron-Phonon Interaction," Journal of Physics Condensed Matter, dated Oct. 2013 (15 pgs).
International Preliminary Report on Patentability issued in application No. PCT/US2017/057209, dated Jun. 4, 2019 (8 pgs).
International Search Report and Written Opinion issued in corresponding PCT Patent Appln. Serial No. PCT/US17/57209 dated Jan. 16, 2018, 10 pgs.

(56) References Cited

OTHER PUBLICATIONS

Office Action issued in U.S. Appl. No. 15/601,820, dated Feb. 27, 2019 (26 pages).
Office Action issued in U.S. Appl. No. 15/601,820, dated Aug. 27, 2018 (28 pages).
Yonkee, B.P., et al., "Demonstration of a III-nitride edge-emitting laser diode utilizing a GaN tunnel junction contact", Optics Express, vol. 24, No. 7, pp. 7816-7822, Apr. 2016.
Young, Lee W., Authorized officer, International Searching Authority, Written Opinion of the International Searching Authority, International Patent Application Serial No. PCT/US06/47448, completion date: Oct. 30, 2008.
Young, Lee W., Authorized officer, International Searching Authority, International Search Report, International Patent Application Serial No. PCT/US06/47448, search date: Nov. 1, 2008.
Polyimide properties data sheet, www.mit.edu, Oct. 27, 2004 (Year 2004).
RO30000 Series Laminates, Rogers Corporation Data sheet (year 2020).
Sunstone, FR-4 PCB Material, Mar. 14, 2017 (Year 2017).
Chen et al., High-T Polymer Dec. 25, 2017 (Year 2017).
Robin K. Huang, Bien Chann, James Burgess, Michael Kaiman, Robert Overman, John D. Glenn, and Parviz Tayebati "Direct diode lasers with comparable beam quality to fiber, CO2, and solid state lasers", Proc. SPIE 8241, High-Power Diode Laser Technology and Applications X, 824102 (Feb. 8, 2012); https://doi.org/10.1117/12.907161 (abstract only).
International Search Report and Written Opinion for PCT International Patent Application Serial No. PCT/US19/46410, dated Nov. 8, 2019 (8 pages).
Official Action issued in corresponding U.S. Appl. No. 16/539,889, dated May 11, 2021, 21 pages.
International Preliminary Report on Patentability issued in International Application Serial No. PCT/US2019/046410, dated Feb. 16, 2021, 6 pages.
European Search Report issued in corresponding European Patent Application Serial No. EP 20 19 646.6, dated Feb. 16, 2021, 7 pages.

\* cited by examiner

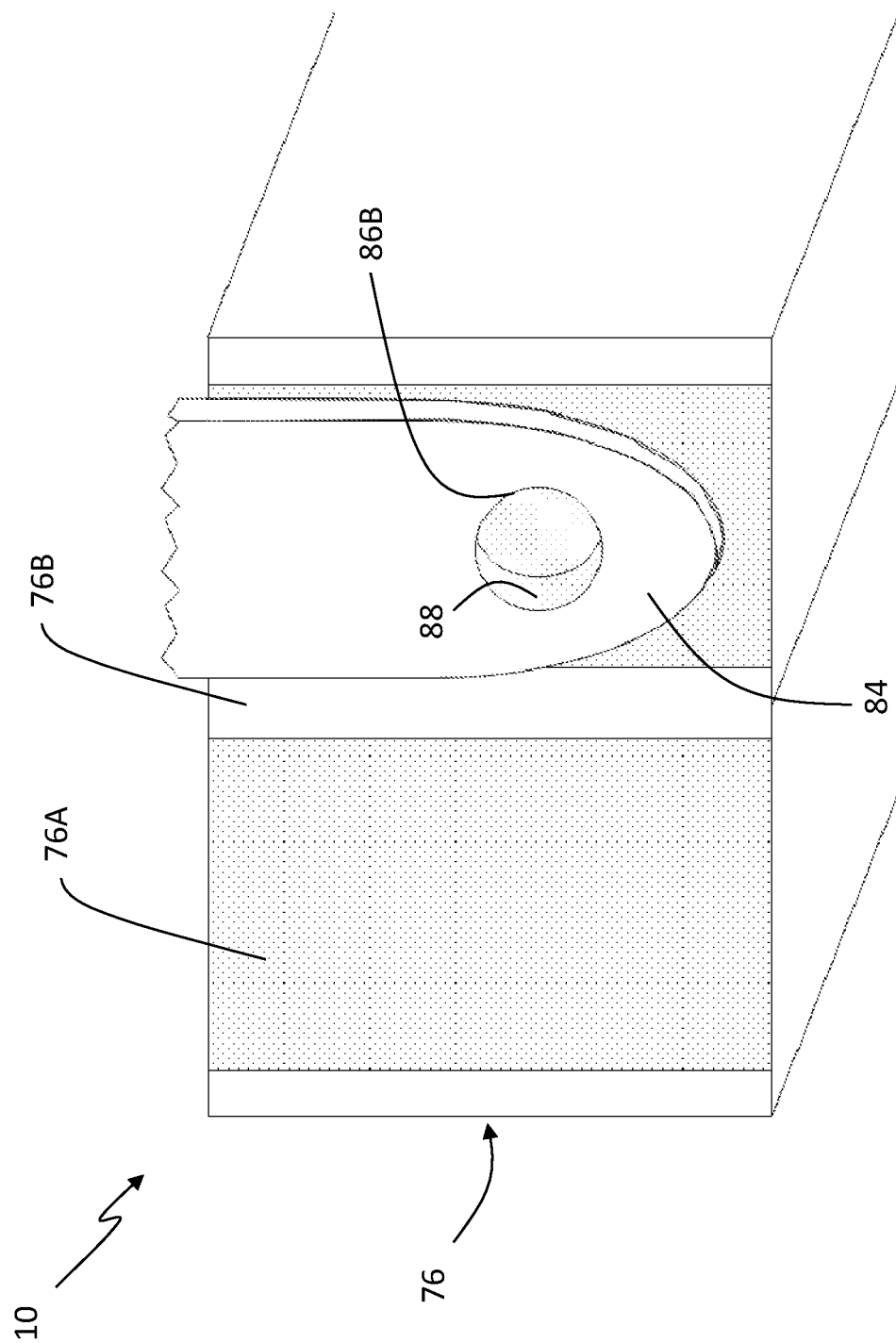

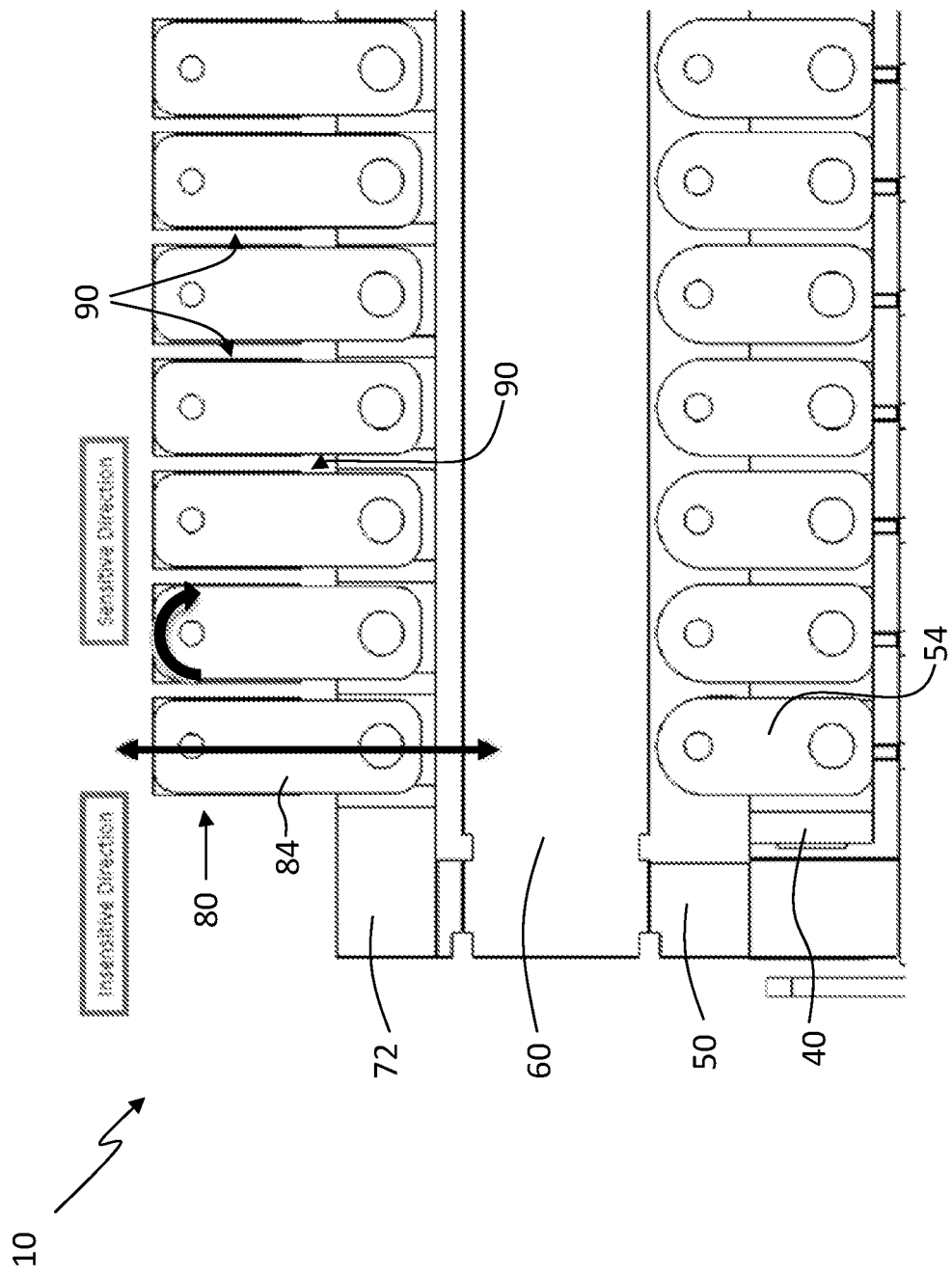

LASER ASSEMBLY AND RELATED METHODS

CROSS REFERENCE TO RELATED APPLICATION

This application claims benefit from the U.S. Provisional Application Ser. No. 62/718,833, filed Aug. 14, 2018, the contents of which are incorporated herein in its entirety, by reference.

FIELD OF THE DISCLOSURE

The present disclosure is generally related to optics assemblies and more particularly is related to laser assemblies and related methods.

BACKGROUND OF THE DISCLOSURE

Conventional laser arrays are assembled using a UV-cure epoxy. The components of the laser assembly, including the lens, collimators, and beam shaping optics are positioned in the desired location relative to one another and an epoxy adhesive is applied to the contact points between the components. For example, in conventional assemblies, epoxy may be used to attach wavelength stabilization optics, such as Volume Bragg Gratings (VBG), typically from the side surfaces thereof. Once the epoxy is applied and the component is positioned correctly, a UV light would be used to cure the epoxy in place. Once cured, the component is released and the next epoxy connection is cured with the UV light until the entire assembly is complete. However, epoxy is not stable over the wide range of temperatures that many laser arrays are required to be operated at. Many laser assemblies are operated in harsh environments which experience fluctuations between high and low temperatures. Over time, the epoxy can creep, which causes shifts and movement of the lens, which in turn, misaligns the optics. When the lens moves, performance of the array is severely diminished or lost because the light is not going where it was necessarily set to at the beginning.

Moreover, the difference in curing between epoxies in different locations can cause misalignments of the optics. For example, when epoxy is applied to the side surfaces of the VBG, the epoxy on the top portion of the side surface may cure at a different rate than the epoxy on the bottom portion of the side surface, or vise-versa, which causes the VBG to rock or shift. This rocking or shift of the VBG can cause a tilt angle which disrupts the intended angle of the VBG, which in turn, misaligns the optics.

Additionally, epoxy is known to outgas. When the epoxy is in its liquid or viscous state, there are certain types of volatiles within it. During manufacture of the laser assembly, manufacturers attempt to cure the epoxy with the UV light quickly to prevent release of the volatiles, but over time, even after the epoxy is cured, there are still some of those volatiles left in. These volatiles will eventually outgas and the chemicals or fumes that come out of the epoxy can damage the laser array if those chemicals or fumes contact the laser facet. Some manufacturers utilize a purge gas in laser system to help make sure the chemicals and fumes being outgassed by the epoxy are flushed out, thereby reducing their volume. Other manufacturers may use thermal-cure epoxies which have less outgassing, but still some exists. While these options can reduce the volume of residue contaminating the laser array, they significantly impact the production efficiency of the laser assemblies. It can take between 20 minutes to over 24 hours to cure thermal epoxy. In a production environment, it is impractical to install one lens at a time and then thermally cure it for that amount of time, and then go onto the next lens. Accordingly, UV-cured epoxies are readily used due to their fast cure time.

Thus, a heretofore unaddressed need exists in the industry to address the aforementioned deficiencies and inadequacies.

SUMMARY OF THE DISCLOSURE

Embodiments of the present disclosure provide a system and apparatus for an epoxy-free laser assembly. Briefly described, in architecture, one embodiment of the assembly, among others, can be implemented as follows. A laser assembly has at least one laser array. At least one optics assembly is positioned within an optical path of at least one laser array, wherein the laser assembly is epoxy-free.

In one aspect, at least one laser array further comprises a plurality of laser diode bars and a plurality of fast axis collimators, wherein a connection between the plurality of laser diode bars and the plurality of fast axis collimators, respectively, further comprises a soldered connection.

In this aspect, the soldered connection further comprises a tab having two holes, wherein solder is applied within each of the two holes.

In this aspect, ends of the plurality of laser diode bars further comprise a metalized surface with spaced, non-metalized grooves formed therein, wherein the solder is applied within one of the two holes of the tab in a position over the metalized surface.

In yet another aspect, at least one optics assembly further comprises a plurality of beam shaping optics and a plurality of wavelength stabilization optics, wherein a connection between the plurality of beam shaping optics and the plurality of wavelength stabilization optics, respectively, further comprises a soldered connection.

In this aspect, the soldered connection further comprises a tab having two holes, wherein solder is applied within each of the two holes.

In this aspect, ends of the plurality of beam shaping optics further comprise a metalized surface with spaced, non-metalized grooves formed therein, wherein the solder is applied within one of the two holes of the tab in a position over the metalized surface.

The present disclosure can also be viewed as providing a system and apparatus for a laser assembly with at least one tab. Briefly described, in architecture, one embodiment of the assembly, among others, can be implemented as follows. A laser assembly has at least one laser array. An optics assembly is positioned within an optical path of at least one laser array. The optics assembly has at least one beam shaping optic and at least one wavelength stabilization optic. At least one wavelength stabilization optic is connected to at least one beam shaping optic with at least one tab.

In one aspect, at least one wavelength stabilization optic further comprises VBG.

In another aspect, at least one tab is connected to an end of at least one wavelength stabilization optic.

In yet another aspect, at least one tab is connected to at least one wavelength stabilization optic and at least one beam shaping optic with epoxy.

In another aspect, at least one tab is connected to at least one wavelength stabilization optic and at least one beam shaping optic with solder.

In this aspect, at least one tab further comprises at least two holes therein, wherein the solder is applied within at least two holes.

The present disclosure can also be viewed as providing a system and apparatus for a laser assembly having a controlled footprint. Briefly described, in architecture, one embodiment of the assembly, among others, can be implemented as follows. A laser assembly has a heatsink assembly having a footprint. At least one laser array is positioned in contact with the heatsink assembly. At least one laser array fits within the footprint of the heatsink assembly. At least two optics assemblies are positioned within an optical path of at least one laser array. All of the optics assemblies fit within the footprint of the heatsink assembly.

In one aspect, the heatsink assembly further comprises two electrical contacts positioned on opposing sides of the heatsink assembly, wherein at least two electrical contacts define two opposing edges of the footprint.

In another aspect, the laser assembly is epoxy-free.

In yet another aspect, at least one electrical isolation ceramic layer is positioned between the heatsink and at least one laser array.

The present disclosure can also be viewed as providing methods of manufacturing a laser assembly. In this regard, one embodiment of such a method, among others, can be broadly summarized by the following steps: positioning at least one laser array in thermal contact with a heatsink; and positioning at least one optics assembly within an optical path of at least one laser array, wherein at least one laser array and at least one optics assembly are epoxy-free.

In one aspect, the method further comprising positioning a plurality of optics assemblies within the optical path of at least one laser array, wherein at least one laser array and all of the plurality of optics assemblies fit within a footprint of the heatsink.

In another aspect, the optics assembly has at least one beam shaping optic and at least one wavelength stabilization optic, and the method further comprising connecting at least one wavelength stabilization optic to at least one beam shaping optic with at least one tab and a quantity of solder.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 5 is an illustration of the laser assembly of FIG. 1A showing the tab, in accordance with the first exemplary embodiment of the present disclosure.

FIG. 6 is a diagrammatical illustration of the laser assembly of FIG. 1A showing sensitivity directions of the tabs, in accordance with the first exemplary embodiment of the present disclosure.

DETAILED DESCRIPTION

Figure 1A:
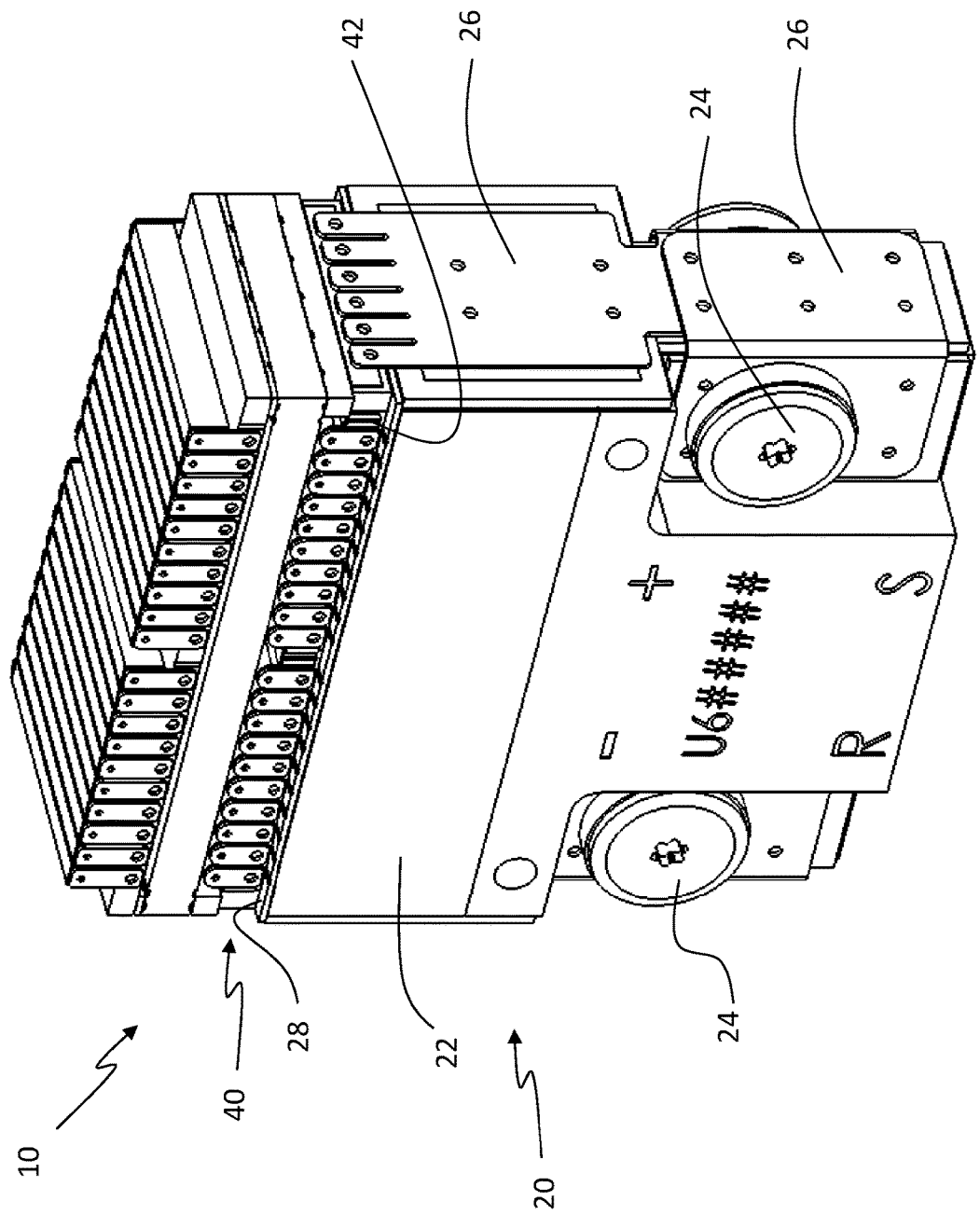
FIG. 1A is an isometric view illustration of a laser assembly, in accordance with a first exemplary embodiment of the present disclosure.
Figure 1B:
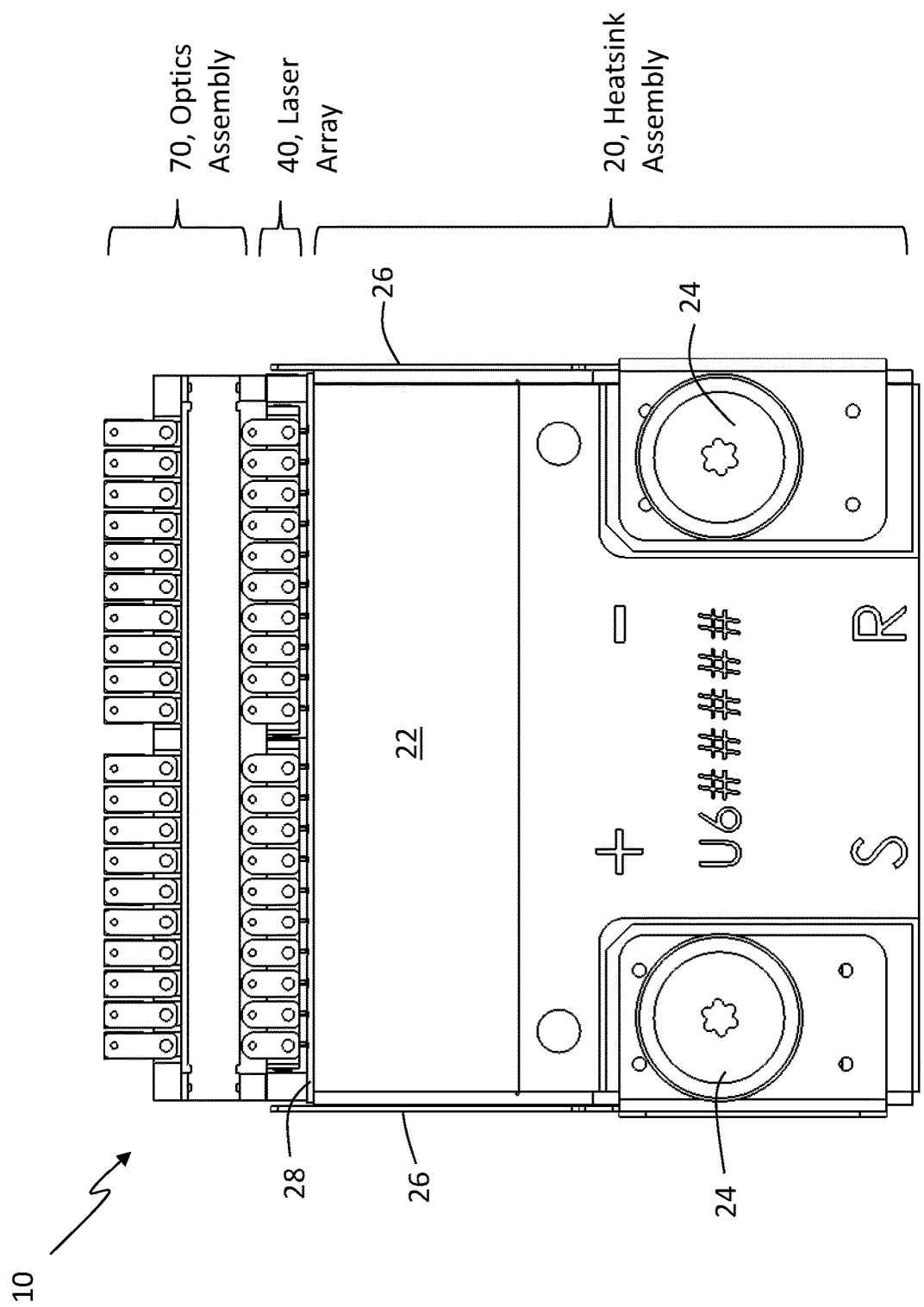
FIG. 1B is a front view illustration of the laser assembly of FIG. 1A, in accordance with the first exemplary embodiment of the present disclosure.
Figure 1C:
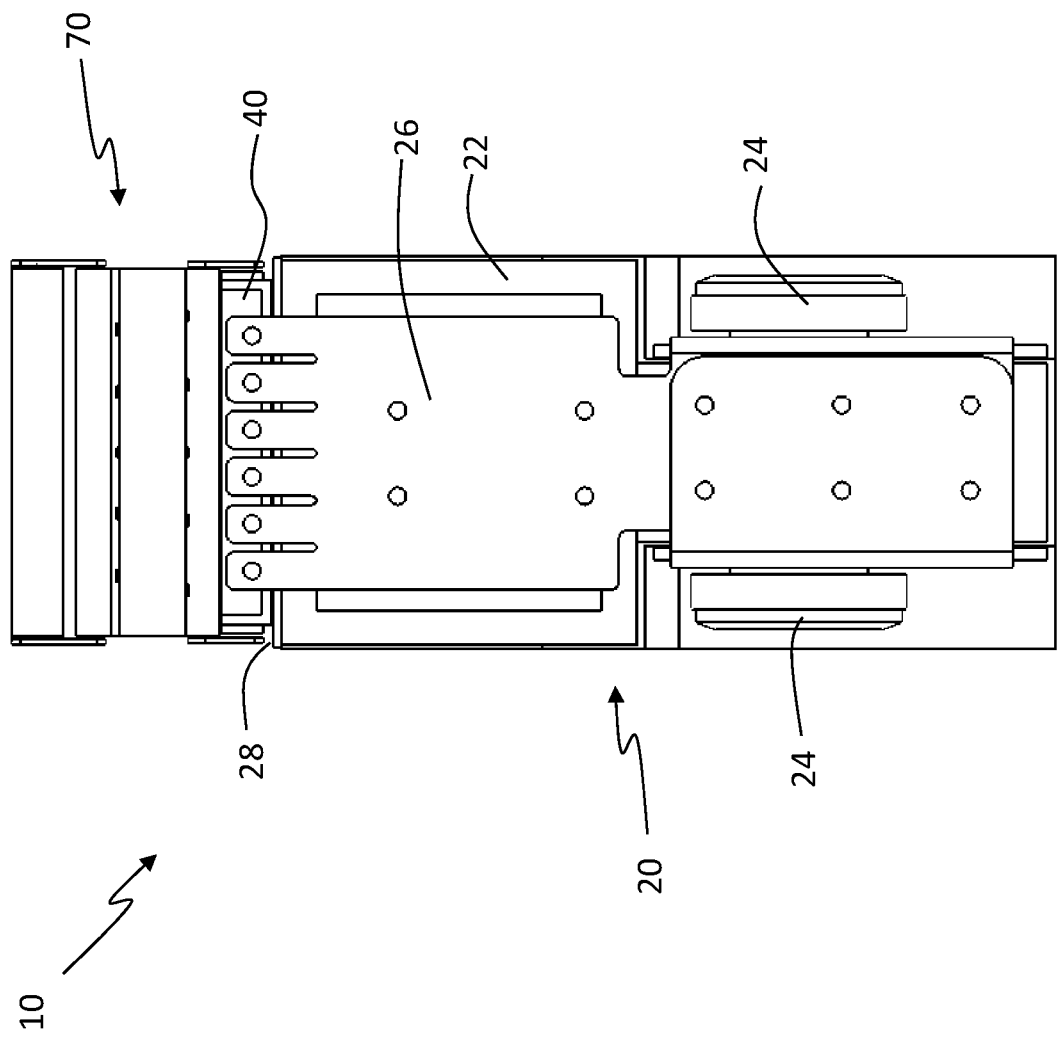
FIG. 1C is a side view illustration of the laser assembly of FIG. 1A, in accordance with the first exemplary embodiment of the present disclosure.

FIG. 1A is an isometric view illustration of a laser assembly 10, in accordance with a first exemplary embodiment of the present disclosure. FIG. 1B is a front view illustration of the laser assembly 10 of FIG. 1A, and FIG. 1C is a side view illustration of the laser assembly 10 of FIG. 1A. With reference to FIGS. 1A-1C, the laser assembly 10, which may be referred to simply as 'assembly 10', 'system 10', or 'apparatus 10', includes a heatsink assembly 20, a laser array 40, and an optics assembly 70. Within the assembly 10, the laser array 40 is positioned in thermal contact with the heatsink assembly 20 and the optics assembly 70, which may include any number of beam shaping optics units, is positioned above the laser array 40 and within an optical path of the laser array 40. The assembly 10 is an epoxy-free unit, in that, it does not use epoxy or epoxy-like adhesives to connect or join components of the assembly 10. However, it is noted that various components of the assembly 10 or benefits thereof can also be used within assemblies that do use epoxy.

In greater detail, the heatsink assembly includes a heatsink 22 formed from a material with high thermal conductivity, electrical attachment screws 24 for connection to a power source, and electrical contacts 26 for transferring an electrical power to the laser array 40. The electrical contacts 26 are electrically contacting the electrical contacting screws 24 and extend upwards to the laser array and optics assembly. The laser array 40 is positioned in thermal contact with the heatsink assembly 20 to allow heat generated within the laser array 40 to be transferred from the array. Commonly, the laser array 40 is positioned on the top face of the heatsink 22. An electrical isolation material such as an electrical isolation ceramic 28 or similar material may be positioned interfacing between a bottom of the laser diode stack in the laser array 40 and the top of the heatsink 22. The optics assembly 70 is positioned above the laser array 40.

Figure 2A:
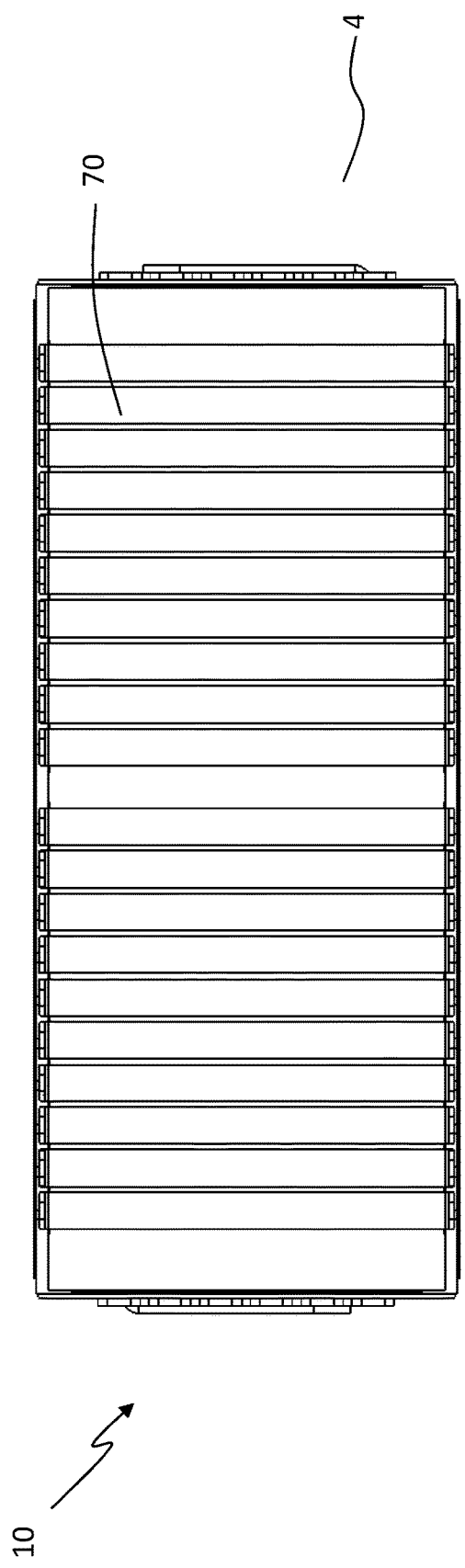
FIG. 2A is a top view illustration of the laser assembly of FIG. 1A, in accordance with the first exemplary embodiment of the present disclosure.
Figure 2B:
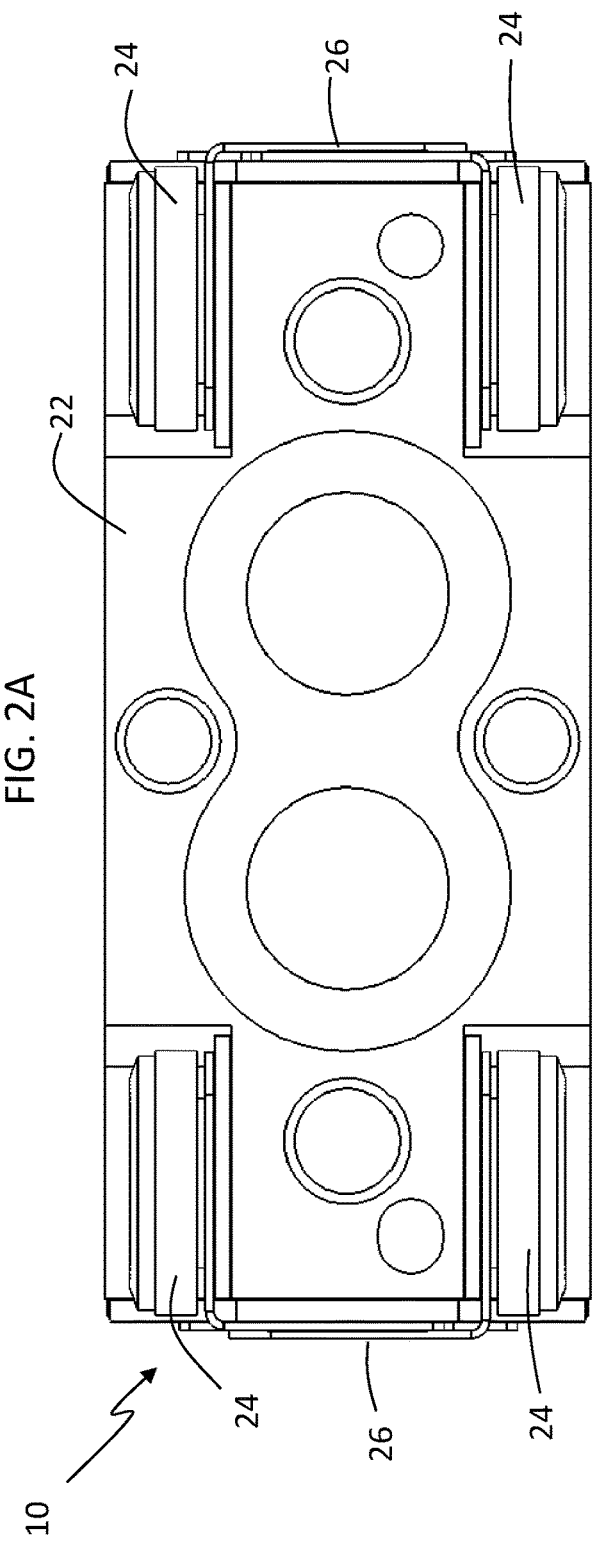
FIG. 2B is a bottom view illustration of the laser assembly of FIG. 1A, in accordance with the first exemplary embodiment of the present disclosure.

FIGS. 2A-2B are top and bottom view illustrations, respectively, of the laser assembly 10 of FIG. 1A, in accordance with the first exemplary embodiment of the present disclosure. In particular, FIGS. 2A-2B illustrate the footprint of the assembly 10 which is generally defined by the shape and size of the heatsink assembly 20, as viewed from the vertical or bird's-eye-view of the assembly 10, as depicted in FIG. 2A. With reference to FIGS. 1A-2B, and as can be seen in FIGS. 2A-2B, the laser array 40 and the beam shaping optics assembly 70 have dimensions which are sized to fit within the footprint of the heatsink assembly 20, in that, the width and length dimensions of the laser array 40 and the optics assembly 70 are sized to be equal to or smaller than the width and length dimensions, respectively, of the heatsink assembly. The ability to maintain the existing footprint of the heatsink assembly 20 allows the existing heatsink assembly 20 design to be used even with additional optical assemblies 70 added to the assembly 10. Accordingly, any number of optical assemblies 70 can be stacked and added to the assembly 10, mounted directly to the laser array 40 or other optics within the optical assembly 70, without affecting the design or sizing conditions of the assembly 10.

In contrast, within the conventional art, when epoxy-free laser assemblies are manufactured, the assemblies utilize structures or systems to hold the lenses within the assemblies, but these structures or systems extend outside of the footprint of the laser array and outside of the footprint of the heatsink. For example, mechanical mounts may be used to hold the lenses of the optics, where the mounts themselves are positioned exterior of the defined footprint of the heatsink to which the laser array is mounted. When more optics or lenses are added, more mounts are required for holding the optics, which causes the assembly to expand in size large enough to interfere with the size constraints of the assembly. Accordingly, the assembly 10 of the subject disclosure can overcome this problem, by both avoiding the use of epoxy within the construction of the assembly 10 and maintaining the existing footprint of the heatsink assembly 20 or laser array 40 all while additional optics are included.

FIGS. 3A-3K are views of the laser assembly 10 of FIG. 1A in various stages of manufacturing, and individual components of the laser assembly 10 of FIG. 1A, in accordance with the first exemplary embodiment of the present disclosure. The systems and components of the assembly 10 are described with reference to FIGS. 1A-3K.

Figure 3A:
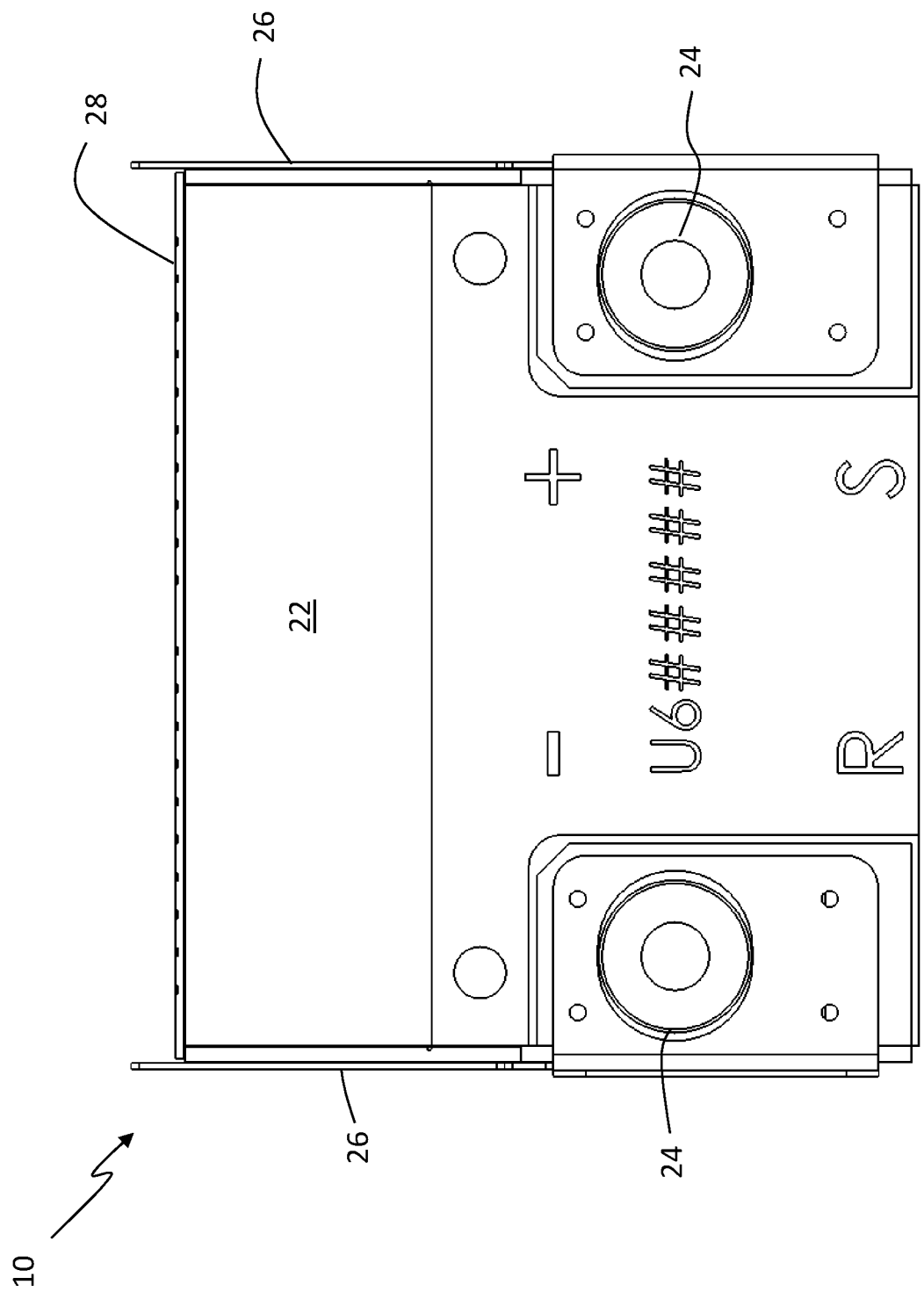
FIGS. 3A-3K are views of the laser assembly of FIG. 1A in various stages of manufacturing, and individual components of the laser assembly of FIG. 1A, in accordance with the first exemplary embodiment of the present disclosure.

FIG. 3A depicts the heatsink assembly 20 having the heatsink 22, electrical attachment screws 24, and electrical contacts 26 for transferring an electrical power to the laser array 40. As can be seen, the electrical isolation ceramic 28 is positioned on the top of the heatsink 22 and between the electrical contacts 26, such that it can provide an electrical barrier between the laser array 40 (not shown in FIG. 3A) and the heatsink 22.

Figure 3B:
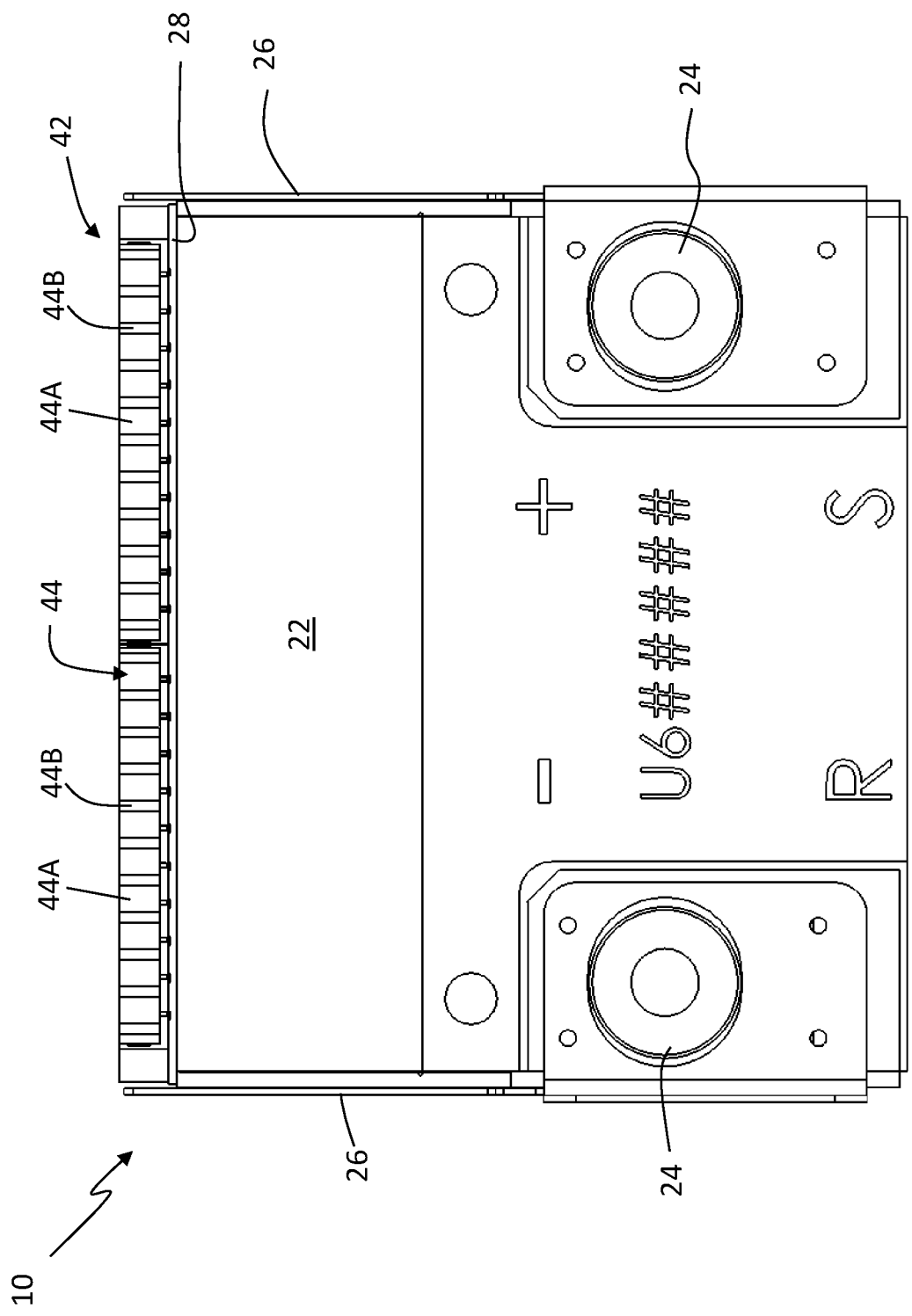

In FIG. 3B, the laser array 40 has been added to the heatsink 22. The laser array 40 includes a laser diode stack having a plurality of laser diode bars 42 positioned next to each other, as is shown in detail in FIG. 3B. The laser array 40 includes an exterior face or end 44 which is positioned along the side of the heatsink 22. The exterior face 44 of the laser array 40 is coated in a metalized material for providing contact with the fast axis collimator 50 (FIGS. 3D-3E) by means of solder. However, to direct the solder to specific portions of the metalized exterior face 44, and to prevent the solder from flowing to a neighboring laser diode bar, spaced areas or grooves have been formed in the metalized exterior face 44. For example, as shown in FIG. 3B, the metalized exterior face 44 includes metalized portions 44A, commonly formed from gold or a similar metal to which solder adheres well to, and non-metalized portions 44B. The non-metalized portions 44B may be created from removing the metal on the metalized exterior face 44 in a location where the non-metalized portion 44B is desired. In one specific example, the exterior face 44 may be metalized with gold and then a saw is used to remove the gold metalized material to form the non-metalized portions 44B. The non-metalized portions 44B align with the spaces between the tabs (FIG. 3D-3E) but the non-metalized portions 44B may be formed before application of the tabs.

Figure 3C:
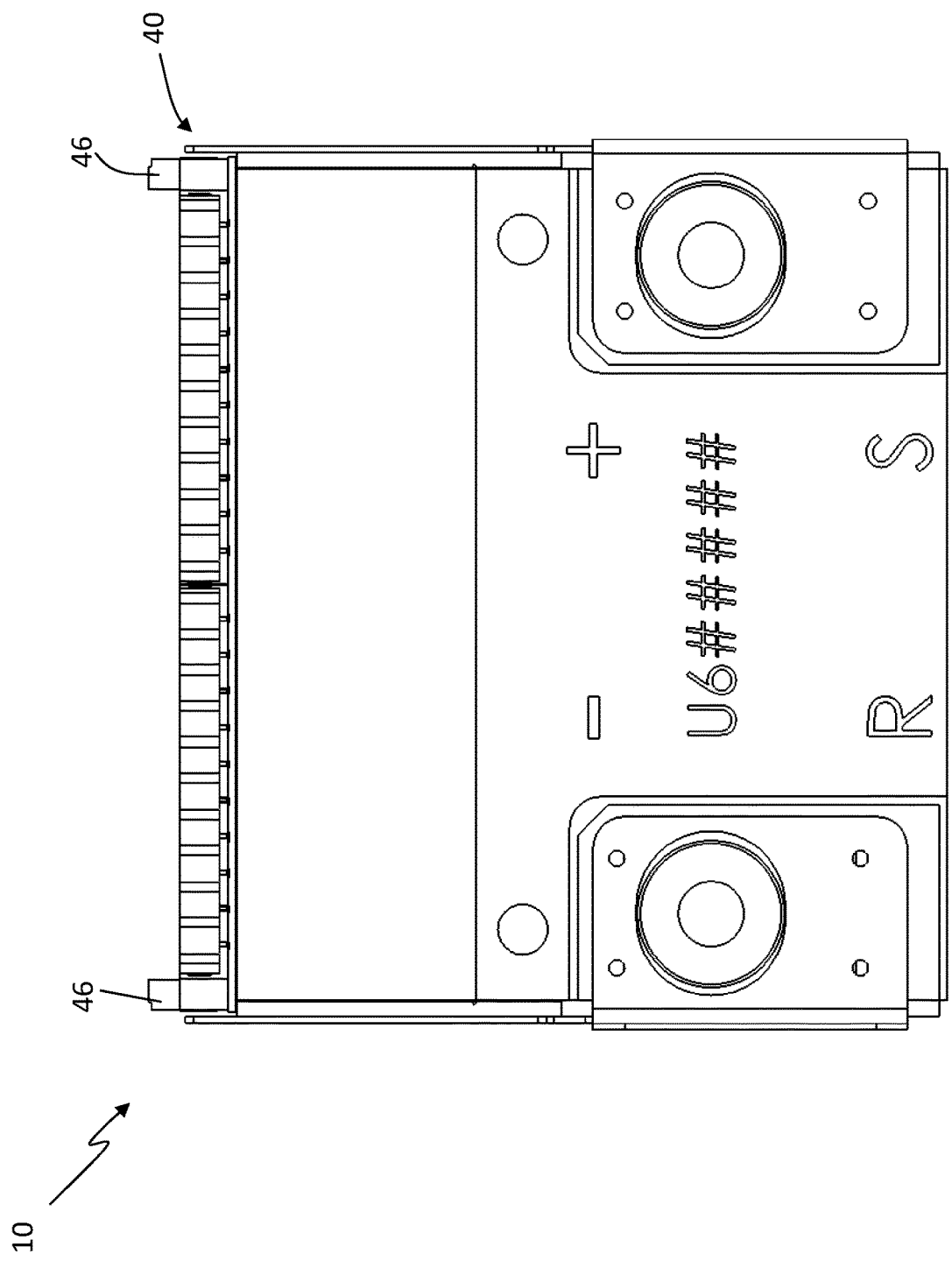

Next, FIG. 3C illustrates the assembly 10 with pedestals 46 formed on the laser array 40. The pedestals 46 providing spacing for the slow axis collimator, discussed relative to FIG. 3F, or appropriate spacing for the next optics unit within the assembly, as may vary by design.

Figure 3E:
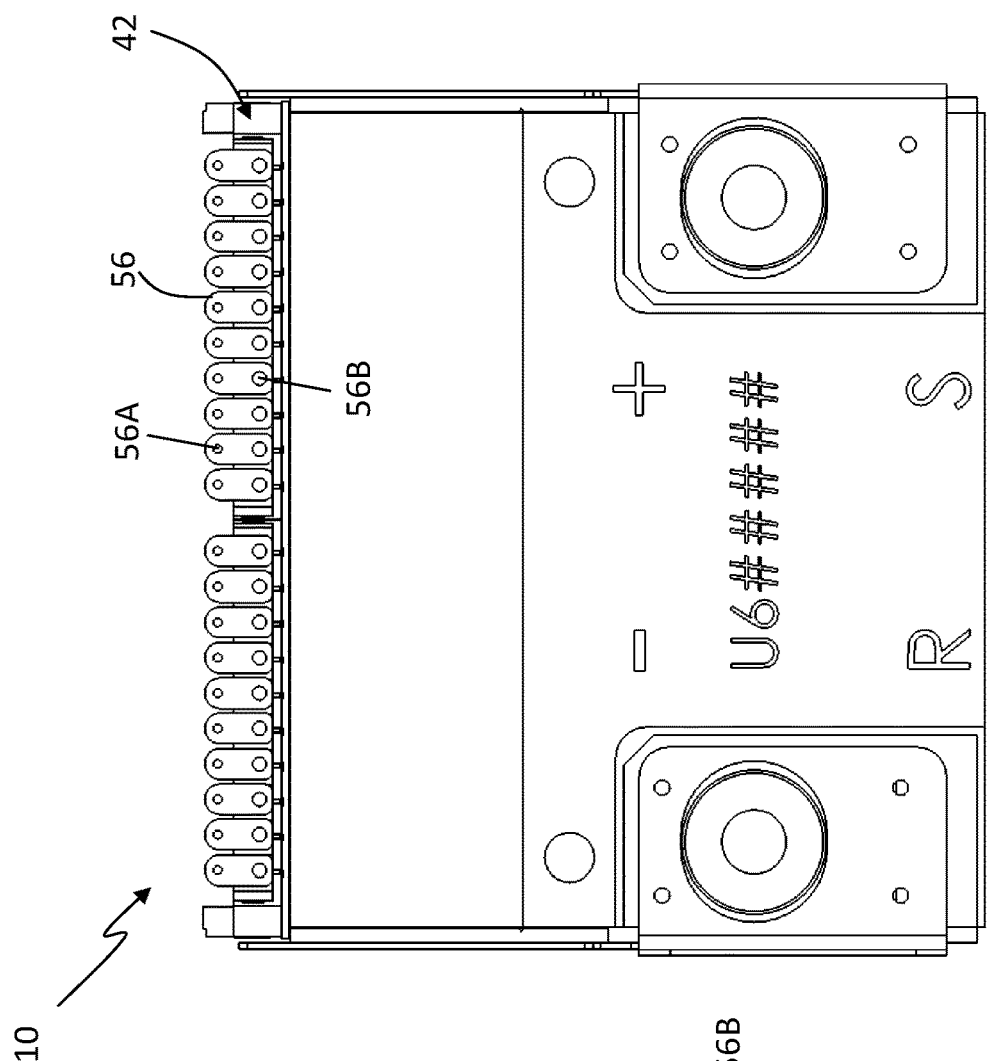
Figure 3D:
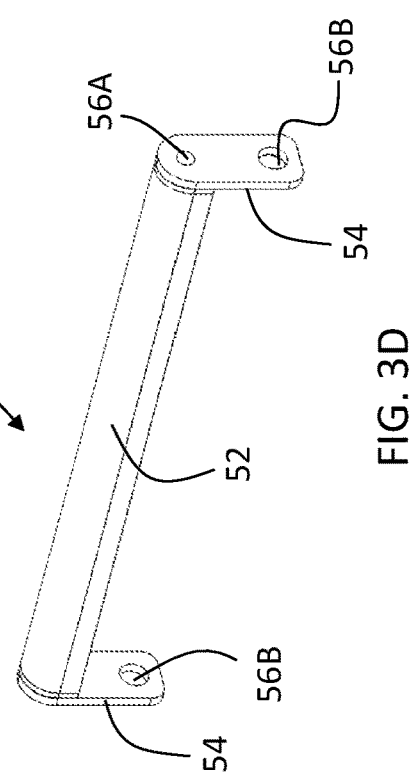

FIG. 3D illustrates the subassembly of the fast axis collimator 50, which includes one fast axis collimator lens 52 and two tabs 54 for retaining the fast axis collimator lens 52 to the laser array 40. The fast axis collimators 50 are the first set of optics that are in front of the optical path of the laser diode bars of the laser array 40. As is known in the art, fast axis collimators may be aspheric cylindrical lenses designed for beam shaping or laser diode collimation. Each of the laser diode bars of the laser array 40 may correspond to an individual fast axis collimator 50 aligned thereto. The tabs 54, which may be formed from metal or another material, may be secured to the exterior ends of the fast axis collimator lens 52 and they generally have two holes 56A, 56B. The holes 56A, 56B may preferably be cylindrical, but other shapes may be employed in certain situations. The first hole 56A may be a small hole on the top of the tab 54, and the second hole 56B may be a larger hole on the bottom of the tab 54. Each fast axis collimator 50 subassembly may be constructed with a fast axis collimator lens 52 and two tabs 54, each with the two holes 56A, 56B.

When the desired number of fast axis collimator 50 subassemblies are manufactured, the number of which generally corresponds to the number of laser diode bars, they may be added to the laser array 40, as shown in FIG. 3E. In this example, 20 laser diode bars and 20 fast axis collimators 50 are depicted, but any number of laser diode bars and fast axis collimators 50 may be used in the assembly 10, as may be dependent on the design and/or intended use of the assembly 10. As is shown in FIG. 3E, the fast axis collimators 50 may be positioned vertically above the laser array 40 such that they are positioned within an optical path of the laser array 40. In this position, the two tabs 54 of the fast axis collimator 50 extend along the exterior face 44 of the laser array 40, e.g., along the ends of each laser diode bar. While the first hole 56A of the tab 54 is used to form a soldered connection to the fast axis collimator lens 52, the second holes 56B may be used to form a soldered connection between the tabs 54 and the laser array 40. Additional details on the soldered connection with the tabs 54 are provided relative to FIGS. 4A-5.

Figure 3F:
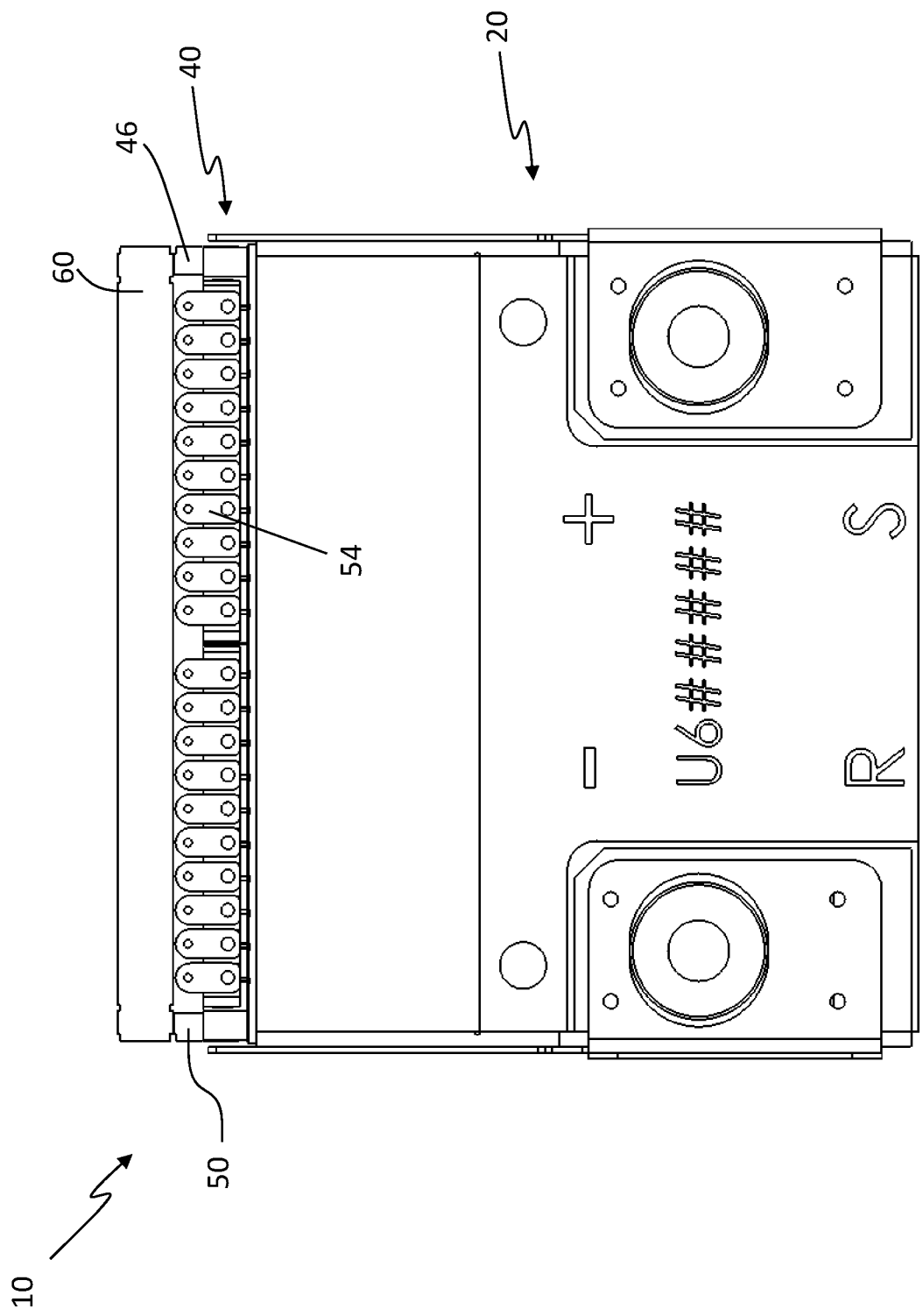

Once the fast axis collimators 50 are connected to the assembly 10, a slow axis collimator 60 may be positioned vertically above the fast axis collimator 50 and in an optical path thereof, as is shown in FIG. 3F. The slow axis collimator 60 sends the light from the laser array 40 in a different direction from the fast axis collimator 50. As is shown, the slow axis collimator 60 may be a monolithic lens formed from a single piece of plate glass. Other materials or structures may also be used, and other bulk optics devices can also be used, such as a monolithic array of cylindrical lenses which collimate the individual emitters of the laser array 40. The slow axis collimator 60 may be attached to the pedestal 46 with solder, where the pedestal 46 is attached to the laser array 40 with solder. Accordingly, thus far in construction of the assembly 10, no epoxy is used.

Figure 3G:
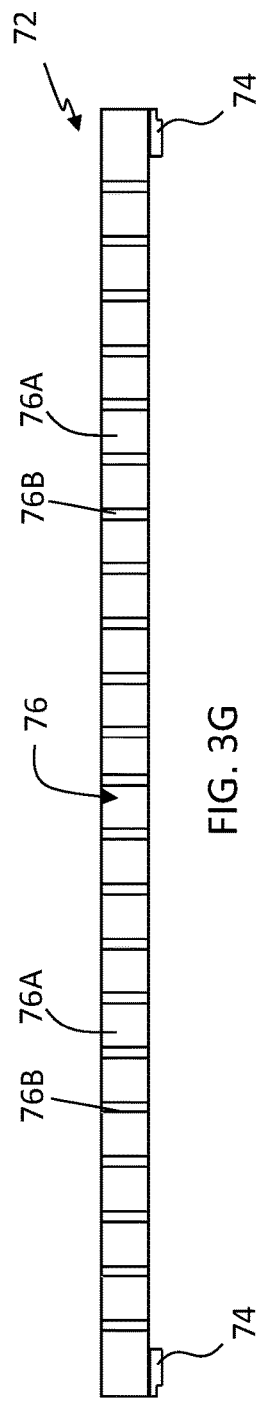
Figure 3H:
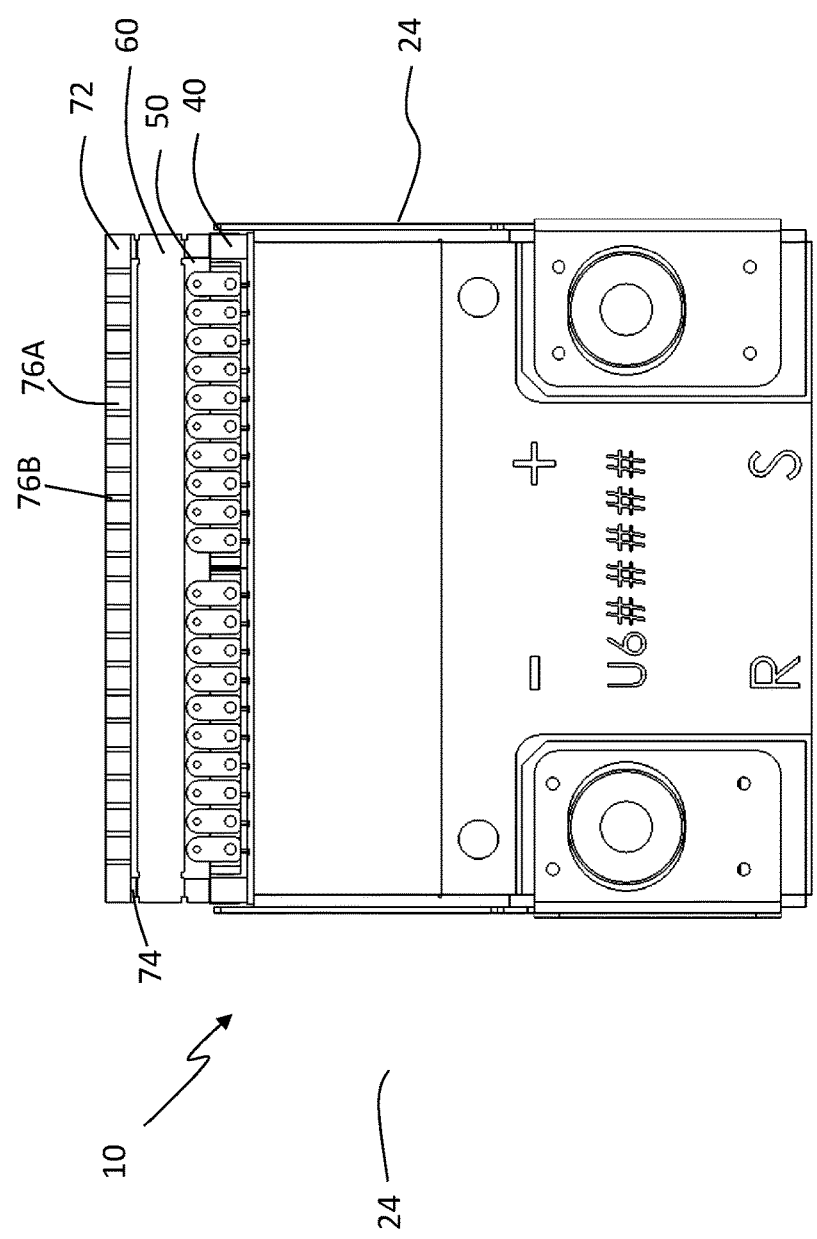

Next, FIG. 3G illustrates the beam shaping optic 72, also known as the advanced optic or AO subassembly, and FIG. 3H illustrates the assembly 10 with the beam shaping optic 72 positioned above the slow axis collimator 60. Each of the laser diode bars of the laser array 40 may have some pointing differences to them. The beam shaping optic 72 may be used to bend the light from the laser diode bars such that all of the laser diode bars are now emitting light in the desired direction. The beam shaping optic 72 may have one or more pedestals 74 or spacers positioned on an underside thereof, which contact the slow axis collimator 60. The pedestals 74 may be connected to the slow axis collimator 60 with a soldered connection.

Similar to the laser array 40, the beam shaping optic 72 has an exterior face or end 76 which is positioned along the long side of the heatsink assembly 20, where the exterior face 76 is coated in a metalized material for providing contact with the wavelength stabilization optic (FIGS. 3I-3K) by means of solder. To direct the solder to specific portions of the metalized exterior face 76, and to prevent the solder from flowing beyond the desired application area, spaced areas or grooves have been formed in the metalized exterior face 76. For example, as shown in FIG. 3G, the metalized exterior face 76 includes metalized portions 76A, commonly formed from gold or a similar metal to which solder adheres well to, and non-metalized portions 76B. The non-metalized portions 76B may be created from removing the metal on the metalized exterior face 76 in a location where the non-metalized portion 76B is desired. In one specific example, the exterior face 76 may be metalized with gold and then a saw is used to remove the gold metalized material to form the non-metalized portions 76B. The non-metalized portions 76B align with the spaces between the tabs, as discussed relative to FIGS. 3I-3K.

Figures 3I, 3J:
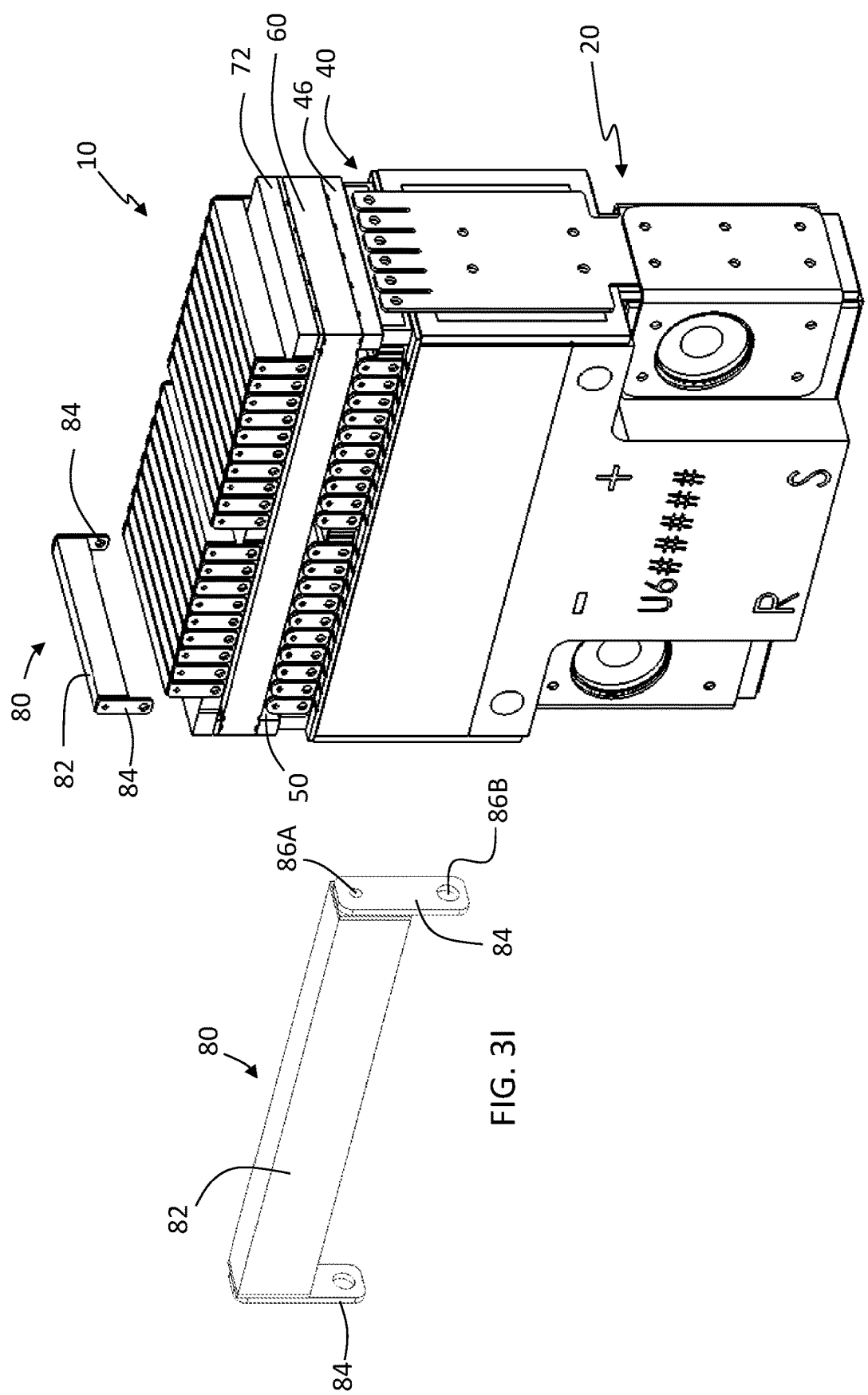
Figure 3K:
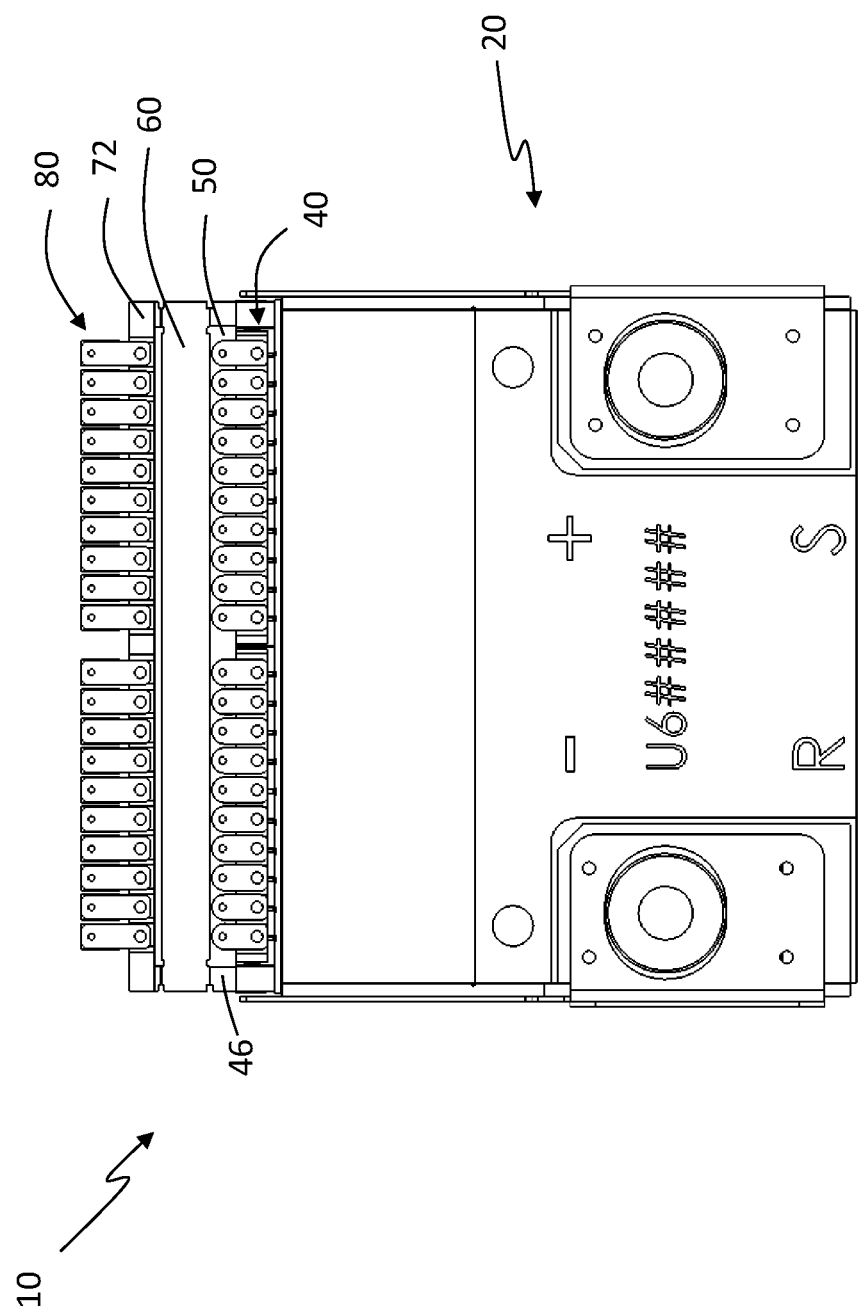

FIG. 3I illustrates the wavelength stabilization optic 80, also referred to as the VBG subassembly. FIG. 3J illustrates the assembly 10 with one of the wavelength stabilization optic 80 in exploded form, while FIG. 3K illustrates a side view of the assembly 10 with wavelength stabilization optic 80. The wavelength stabilization optic 80 may allow for stabilization of the wave length. Depending on the VBG 82 that is selected, it may hard-lock the wave length at the desired value, and feed back into the other wave length colors that are being produced by the laser diode bar. The wavelength stabilization optic 80 includes a VBG 82 and two tabs 84 positioned on the ends of the VBG 82, as shown in FIG. 3I. Each of the two tabs 84 includes a first hole 86A, positioned at a top of the tab 84 and used for controlling a soldered connection with the VBG 82, and a second hole 86B which is smaller than the first hole 86A, where the second hole 86B is positioned on the bottom of the tab 84 and is used for controlling a soldered connection with the beam shaping optic 72.

As is shown in FIGS. 3J-3K, the wavelength stabilization optic 80 may be positioned vertically above beam shaping optics 72, such that each wavelength stabilization optic 80 is positioned within an optical path of the corresponding beam shaping optic 72 below it. In this position, the two tabs 84 of the wavelength stabilization optic 80 extend along the exterior face 76 of the beam shaping optic 72, e.g., along the ends thereof. The second holes 86B are then aligned to the exterior face 76 of the beam shaping optic 72 such that a soldered connection or joint can be formed between the tab 84 and the beam shaping optic 72, the details of which are discussed relative to FIGS. 4A-5.

Figure 4A:
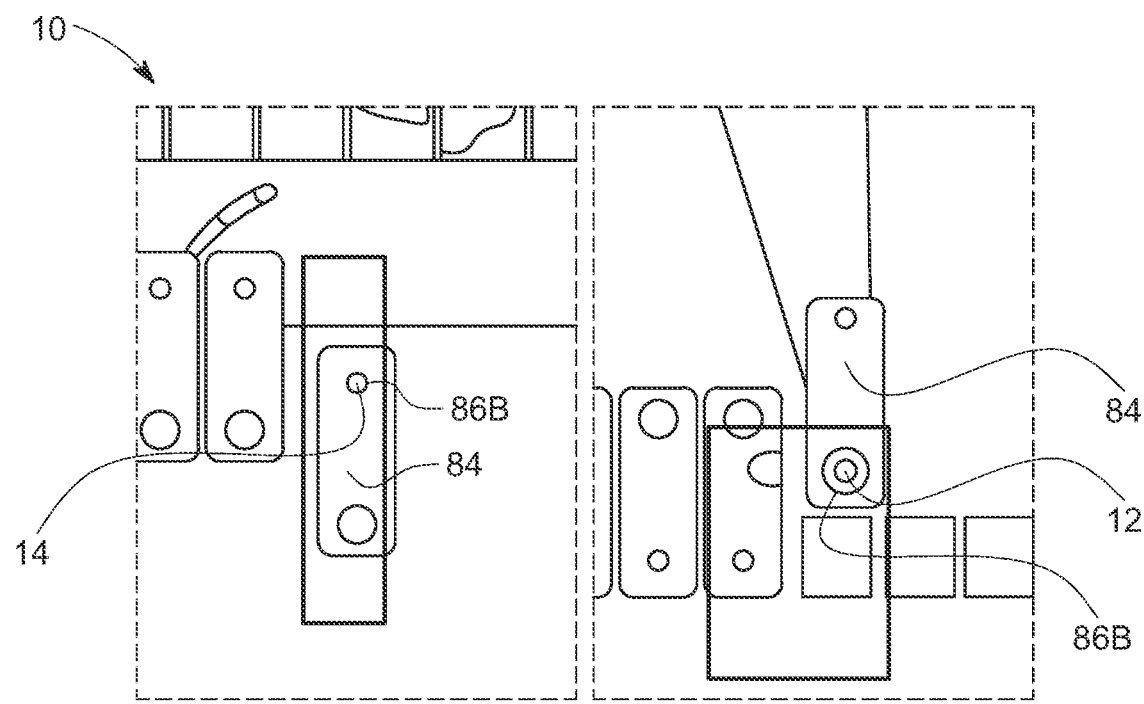
FIGS. 4A-4B are front view illustrations of the laser assembly of FIG. 1A showing the tab and soldered connection, in accordance with the first exemplary embodiment of the present disclosure.
Figure 4B:
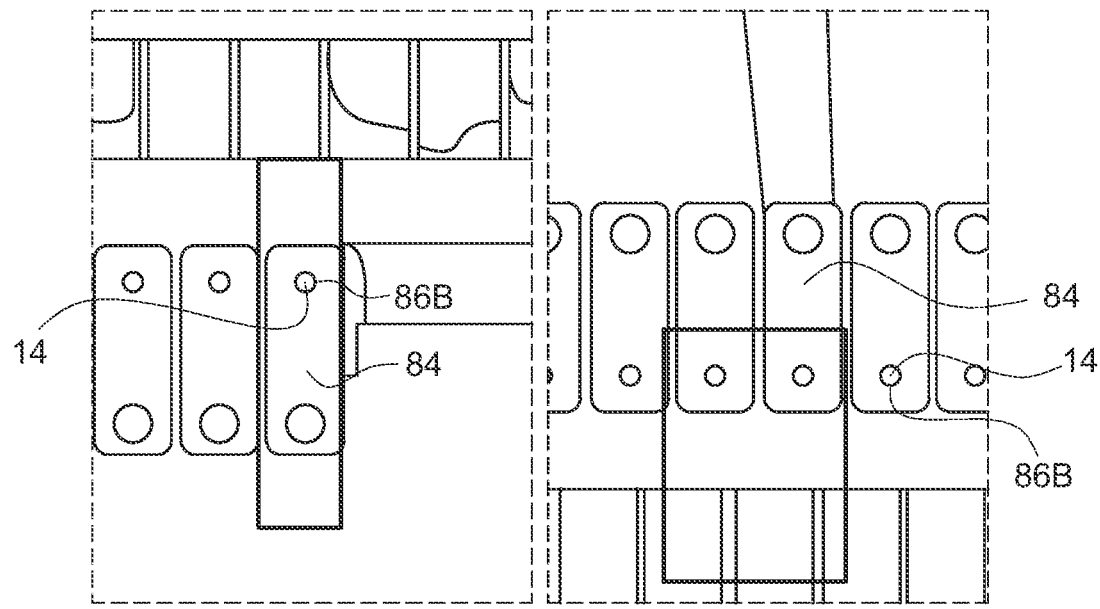

FIGS. 4A-4B are front view illustrations of the laser assembly 10 of FIG. 1A showing the tab and soldered connection, in accordance with the first exemplary embodiment of the present disclosure. FIG. 5 is an illustration of the laser assembly 10 of FIG. 1A showing the tab, in accordance with the first exemplary embodiment of the present disclosure. With reference to FIGS. 3H-5, the soldered connection may be used in the assembly 10 with the tabs, as described for use between the fast axis collimator 50 and the laser array 40, and between the wavelength stabilization optics 80 and the beam shaping optics 72. For clarity in disclosure, the process of creating the soldered connection is described relative to the user of the tab 84 between the wavelength stabilization optics 80 and the beam shaping optics 72, but the same process may be used for the tab 54 between the fast axis collimator 50 and the laser array 40.

As is shown in FIG. 4A, the tab 84 may receive a solder ball 12 within the second hole 86B thereof, which is positioned overlying the metalized portion 76A of the exterior face 76 of the beam shaping optic 72. The solder ball 12 may include an encapsulation material and/or shield gas. Once the solder ball 12 is positioned within the second hole 86B, the solder ball is heated, e.g., with a light, and the solder flows within the interior of the second hole 86B and in between the inner-facing surface of the tab 84, which is also a metalized surface, and the abutting surface of the metalized portion 76A of the exterior face of the beam shaping optic 72. Since the solder tends to only want to go where there's a metalized surface on the metalized portion 76A, it does not flow into the non-metalized portions 76B, and therefore is kept within the metalized portion 76A. Thus, the soldered connection maintains the desired contact between the tabs 84 and the intended portions of the exterior face 76, and does not migrate to undesired locations along the exterior face 76. FIG. 4B illustrates the flowed solder 14 within the second hole 86B of the tab 84.

As is shown in FIG. 5, the specific shape and materials of the tab 84 may be used to control the soldered connection. Here, the second hole 86B of the tab 84 may have an interior sidewall 88 which is also formed to have a metalized surface. For instance, the interior sidewall 88 of the second hole 86B may be coated with gold. When the solder ball (not shown) is positioned within the second hole 86B and melted, the solder is attracted to form a connection between the inner sidewall 88 of the second hole 86B and the metalized surface 76B of the exterior face 76. The outer surface of the tab 84 may be formed from a non-attractive material to solder, for example, titanium or glass, which causes the solder to migrate into the second hole 86B and towards the metalized surface 76B. When cooled, the solder will dry through the second hole 86B onto the interior sidewall 88 of the second hole 86B, and on the inner surface of the tab 84, e.g., the surface facing the metalized surface 76A of the exterior face 76.

The same solder technique can be used with the other soldered connections formed with tabs. Additionally, as optic structures can also be gold metalized to direct the solder to the locations where soldered joints are desired, and non-desired locations can be coated with solder repelling materials, such as titanium. In this way, the assembly 10 as a whole can be formed as an epoxy-free assembly, since epoxy adhesives or similar adhesives are not required for creating or maintaining connections between components. Accordingly, the assembly 10 can improve over the shortcomings of the prior art discussed in the Background, namely since the assembly 10 will not experience creep or shifting of components due to curing epoxy or long-term use of epoxy.

FIG. 6 is a diagrammatical illustration of the laser assembly 10 of FIG. 1A showing sensitivity directions of the tabs, in accordance with the first exemplary embodiment of the present disclosure. As shown, FIG. 6 depicts the tabs 54 between the fast axis collimator 50 and the laser array 40, and between the wavelength stabilization optics 80 and the beam shaping optics 72. Beyond the fact that the assembly 10 is constructed as an epoxy-free structure, the use of the tabs 54/84 can provide significant improvements over misalignments conventionally seen in laser assemblies, in part, due to the use of tabs 54/84 which allow for better alignment of optics and mounting of optics in a manner which compensates for sensitivity directions. For example, conventional assemblies mount optics using their side surfaces 90, e.g., the elongated side or bottom surfaces of the optic, as indicated in FIG. 6. When mounting occurs on these surfaces, any movement in the joint formed on these surfaces can cause the optic to tilt or become misaligned about the elongated axis of the optic. It is not uncommon for movement to occur due to temperate changes or forces within the environment the assembly is used within. The optics are very sensitive to misalignments in this direction, i.e., in the sensitive direction, as labeled in FIG. 6. Accordingly, any misalignment of the optic in this direction can cause complications and/or failures in the assembly.

In contrast, the assembly 10 of the subject disclosure mounts the optics using the tabs 54/84 positioned on the ends of the optics, such that any misalignments in the joints formed against the tabs 54/84 does not cause misalignments of the optics in the sensitive direction. Rather, movements in the joints formed against the tabs 54/84 would cause misalignments in the insensitive direction, as labeled in FIG. 6, such that the optics may move in a vertical direction, and angular movement or tilting movement would be greatly minimized. Since the angle of the optic units, and in particular, the angle of the wavelength stabilization optic, is very critical, mounting the optics with the tabs 54/84 can remove the criticality of tilt. This results in more accurately position the optics during manufacture and more accurately hold the optics in that position throughout use of the assembly 10 than is conventionally available. Moreover, when this difference in structure relative to the prior art is combined with an epoxy-free assembly, where the connections and joints are formed with solder or a similar material, the quality of the resulting assembly can be vastly improved over what is conventionally available.

Figure 7:
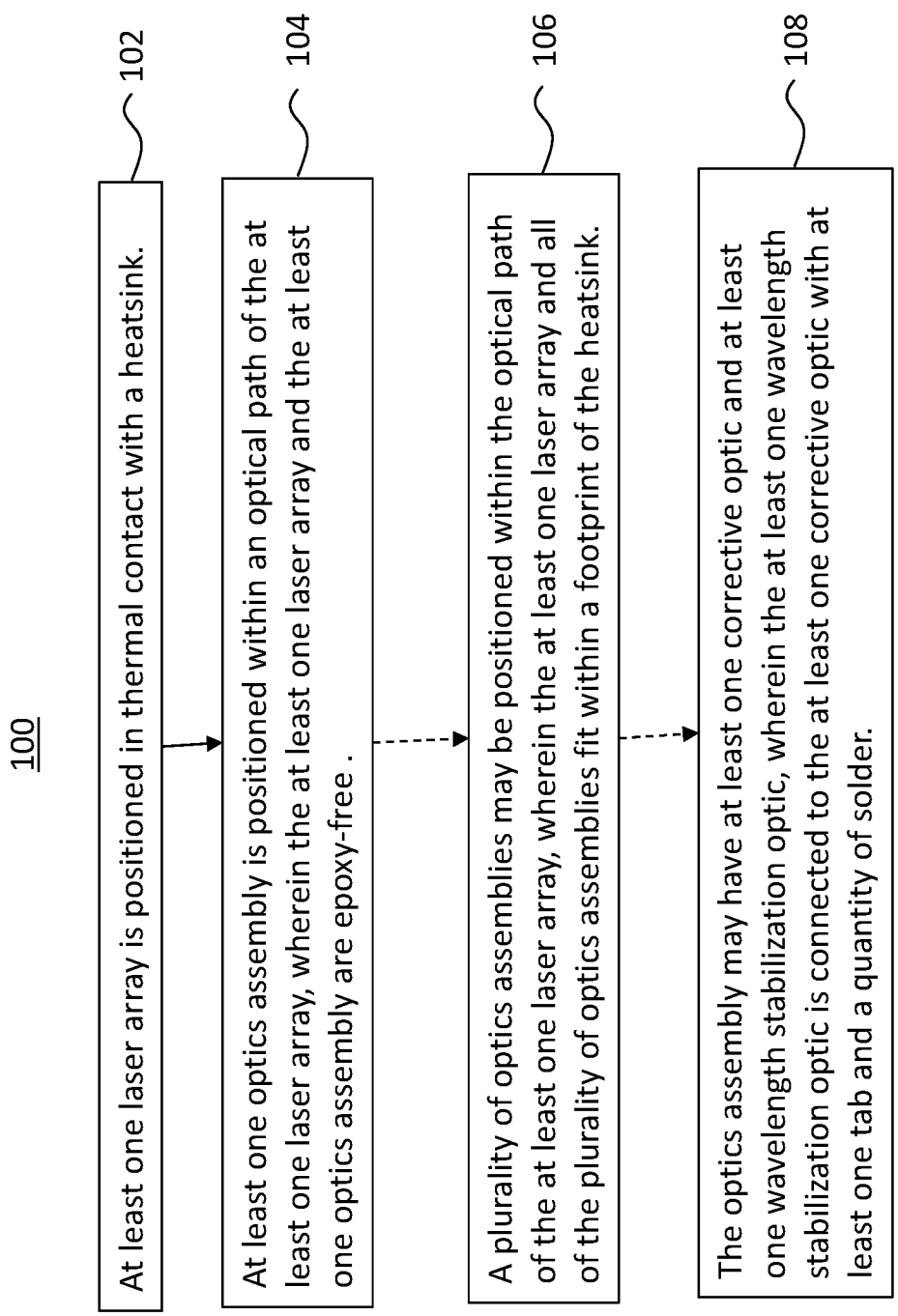
FIG. 7 is a flowchart illustrating a method of manufacturing a laser assembly, in accordance with the first exemplary embodiment of the present disclosure.

FIG. 7 is a flowchart 100 illustrating a method of manufacturing a laser assembly, in accordance with the first exemplary embodiment of the present disclosure. It should be noted that any process descriptions or blocks in flow charts should be understood as representing modules, segments, portions of code, or steps that include one or more instructions for implementing specific logical functions in the process, and alternate implementations are included within the scope of the present disclosure in which functions may be executed out of order from that shown or discussed, including substantially concurrently or in reverse order, depending on the functionality involved, as would be understood by those reasonably skilled in the art of the present disclosure.

As is shown by block 102, at least one laser array is positioned in thermal contact with a heatsink. At least one optics assembly is positioned within an optical path of at least one laser array, wherein at least one laser array and at least one optics assembly are epoxy-free (block 104). The method may include any number of additional steps, functions, or structures, including any disclosed relative to any other figure of this disclosure. For example, a plurality of optics assemblies may be positioned within the optical path of at least one laser array, wherein at least one laser array and all of the plurality of optics assemblies fit within a footprint of the heatsink (block 106). Additionally, the optics assembly may have at least one beam shaping optic and at least one wavelength stabilization optic, wherein at least one wavelength stabilization optic is connected to at least one beam shaping optic with at least one tab and a quantity of solder (block 108).

It should be emphasized that the above-described embodiments of the present disclosure, particularly, any "preferred" embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A laser assembly comprising:
    at least one laser array having a footprint, the at least one laser array having a plurality of laser diode bars and a plurality of fast axis collimators, wherein a connection between the plurality of laser diode bars and the plurality of fast axis collimators, respectively, comprises a soldered connection;
    at least one optics assembly positioned within an optical path of at least one laser array, the at least one optics assembly fitting the footprint of the at least one laser array, wherein the laser assembly is epoxy-free; and
    at least one tab extending vertically between the at least one laser array and the at least one optics assembly, wherein the at least one tab is soldered with the soldered connection to the at least one laser array and the at least one optics assembly.

2. The laser assembly of claim 1, wherein the soldered connection further comprises the tab having two holes, wherein solder is applied within each of the two holes.

3. The laser assembly of claim 2, wherein ends of the plurality of laser diode bars further comprise a metalized surface with spaced, non-metalized grooves formed therein, wherein the solder is applied within one of the two holes of the tab in a position over the metalized surface.

4. The laser assembly of claim 3, wherein the soldered connection further comprises a tab having two holes, wherein solder is applied within each of the two holes.

5. The laser assembly of claim 4, wherein ends of the plurality of beam shaping optics further comprise a metalized surface with spaced, non-metalized grooves formed therein, wherein the solder is applied within one of the two holes of the tab in a position over the metalized surface.

6. The laser assembly of claim 1, wherein at least one optics assembly further comprises a plurality of beam shaping optics and a plurality of wavelength stabilization optics, wherein a connection between the plurality of beam shaping optics and the plurality of wavelength stabilization optics, respectively, further comprises a soldered connection.

7. A laser assembly comprising:
    at least one laser array; and
    an optics assembly positioned within an optical path of at least one laser array, the optics assembly having at least one beam shaping optic and at least one wavelength stabilization optic, wherein at least one wavelength stabilization optic is connected to at least one beam shaping optic with at least one tab, and wherein at least one wavelength stabilization optic further comprises a Volume Bragg Gratings (VBG).

8. The laser assembly of claim 7, wherein at least one tab is connected to an end of at least one wavelength stabilization optic.

9. The laser assembly of claim 7, wherein at least one tab is connected to at least one wavelength stabilization optic and at least one beam shaping optic with epoxy.

10. The laser assembly of claim 7, wherein at least one tab is connected to at least one wavelength stabilization optic and at least one beam shaping optic with solder.

11. The laser assembly of claim 10, wherein at least one tab further comprises at least two holes therein, wherein the solder is applied within at least two holes.

12. A laser assembly comprising:
a heatsink assembly having a footprint;
at least one laser array position in contact with the heatsink assembly, wherein at least one laser array fits within the footprint of the heatsink assembly;
at least two optics assemblies positioned within an optical path of at least one laser array, wherein all of at least two optics assemblies fit within the footprint of the heatsink assembly; and
two electrical contacts positioned on opposing sides of the heatsink assembly, wherein at least two electrical contacts define two opposing edges of the footprint.

13. The laser assembly of claim 12, wherein the laser assembly is epoxy-free.

14. The laser assembly of claim 12, further comprising at least one electrical isolation ceramic layer positioned between the heatsink and at least one laser array.

15. A method of manufacturing a laser assembly, the method comprising:
positioning at least one laser array in thermal contact with a heatsink, wherein the at least one laser array and heatsink have a footprint; and
positioning at least one optics assembly within an optical path of at least one laser array, wherein at least one laser array and at least one optics assembly are epoxy-free, the at least one optics assembly fitting the footprint of the at least one laser array and heatsink; and
at least one tab extending vertically between the at least one laser array and the at least one optics assembly, wherein the at least one tab is soldered with a soldered connection to the at least one laser array and the at least one optics assembly, wherein the at least one laser array has a plurality of laser diode bars and a plurality of fast axis collimators, wherein a connection between the plurality of laser diode bars and the plurality of fast axis collimators, respectively, comprises the soldered connection.

16. The method of claim 15, further comprising positioning a plurality of optics assemblies within the optical path of at least one laser array, wherein the at least one laser array and all of the plurality of optics assemblies fit within the footprint of the heatsink.

17. The method of claim 15, wherein the optics assembly has at least one beam shaping optic and at least one wavelength stabilization optic, further comprising connecting at least one wavelength stabilization optic to at least one beam shaping optic with at least one tab and a quantity of solder.

* * * * *